(12) United States Patent
Senoo

(10) Patent No.: US 8,610,204 B2
(45) Date of Patent: Dec. 17, 2013

(54) SEMICONDUCTOR DEVICE

(75) Inventor: Masaru Senoo, Okazaki (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/698,606

(22) PCT Filed: Mar. 15, 2011

(86) PCT No.: PCT/JP2011/056053
§ 371 (c)(1),
(2), (4) Date: Nov. 16, 2012

(87) PCT Pub. No.: WO2012/124056
PCT Pub. Date: Sep. 20, 2012

(65) Prior Publication Data
US 2013/0056822 A1 Mar. 7, 2013

(51) Int. Cl.
H01L 29/80 (2006.01)
H01L 29/76 (2006.01)
H01L 29/78 (2006.01)
H01L 21/28 (2006.01)
H01L 21/336 (2006.01)

(52) U.S. Cl.
USPC 257/330; 257/E21.41; 257/331; 257/E29.262; 257/E21.158; 257/E21.577; 257/341; 257/327; 257/328; 257/139

(58) Field of Classification Search
USPC .......................................................... 257/330
See application file for complete search history.

(56) References Cited

U.S. PATENT DOCUMENTS

2008/0012050 A1* 1/2008 Aoki et al. ..................... 257/262
2010/0032752 A1* 2/2010 Hozumi et al. ............... 257/331

FOREIGN PATENT DOCUMENTS

| JP | H9-082954 A | 3/1997 |
| JP | 2003-174166 A | 6/2003 |
| JP | 2003-188379 A | 12/2003 |
| JP | 2004-158680 A | 6/2004 |
| JP | 2010-050307 A | 3/2010 |
| JP | 2010-283128 A | 12/2010 |

* cited by examiner

*Primary Examiner* — Thao Le
*Assistant Examiner* — Long Le
(74) *Attorney, Agent, or Firm* — Kenyon & Kenyon LLP

(57) ABSTRACT

A first semiconductor device comprising: a first conductivity type drift region formed in a semiconductor substrate; a second conductivity type body region formed at an upper surface of the semiconductor substrate on an upper surface side of the drift region; a first conductivity type first semiconductor region formed on a part of an upper surface of the body region; and a trench gate type insulated gate penetrating the first semiconductor region and the body region, and formed to a depth at which the insulated gate contacts the drift region. A part of the insulated gate on a drift region side relative to the body region is deeper at a center portion than at both end portions in a longitudinal direction of the insulated gate.

2 Claims, 23 Drawing Sheets

SEMICONDUCTOR DEVICE

This is a 371 national phase application of PCT/JP2011/056053 filed 15 Mar. 2011, the contents of which are incorporated herein by reference.

TECHNICAL FIELD

The techniques described in the present description relate to a semiconductor device comprising a trench type insulated gate.

BACKGROUND ART

In a trench gate type semiconductor device, an excessive electric field concentration occurring at a bottom portion of a trench type insulated gate results in destruction of the semiconductor device. In order to prevent an electric field concentration, for example, Japanese Patent Application Publication No. H9-82954 (Patent Document 1) and Japanese Patent Application Publication No. 2003-174166 (Patent Document 2) describe setting a depth of a trench of an insulated gate at an outermost periphery of an actual operation region shallower than a depth of a trench of another insulated gate in the actual operation region. In addition, Japanese Patent Application Publication No. 2004-158680 (Patent Document 3) describes setting a depth of a trench of an insulated gate at an outermost periphery of an actual operation region deeper than a depth of a trench of another insulated gate in the actual operation region. In these conventional techniques, trenches of the respective insulated gates have a uniform depth in a longitudinal direction.

CITATION LIST

Patent Literature

Patent Document 1: Japanese Patent Application Publication No. H9-82954
Patent Document 2: Japanese Patent Application Publication No. 2003-174166
Patent Document 3: Japanese Patent Application Publication No. 2004-158680

SUMMARY OF INVENTION

Technical Problem

Semiconductor devices in conventional art are designed so as to mitigate an electric field concentration by respectively setting trenches of a plurality of insulated gates to different depths. However, a variation in the trench depths may occur when forming insulated gates during a process of manufacturing a semiconductor device. The variation in the trench depth occurs at each insulated gate, and a degree of the variation is not necessarily consistent among the plurality of insulated gates. Therefore, in some cases, an electric field concentration cannot be mitigated.

Solution to Technical Problem

A first semiconductor device disclosed in the present description comprises: a first conductivity type drift region formed in a semiconductor substrate; a second conductivity type body region formed at an upper surface of the semiconductor substrate on an upper surface side of the drift region; a first conductivity type first semiconductor region formed on a part of an upper surface of the body region; and a trench gate type insulated gate penetrating the first semiconductor region and the body region, and formed to a depth at which the insulated gate contacts the drift region. A part of the insulated gate on a drift region side relative to the body region is deeper at a center portion than at both end portions in a longitudinal direction of the insulated gate.

In the semiconductor device described above, a part of the insulated gate on the drift region side relative to the body region is deeper at the center portion than at both end portions in the longitudinal direction. Therefore, an electric field concentration can be mitigated by gradually varying an electric field along the longitudinal direction of the insulated gate. In a process of manufacturing the semiconductor device, since a variation in a trench depth is small in the longitudinal direction of a single insulated gate, a reduction of an effect of mitigating the electric field concentration can be suppressed.

A bypass portion in which the first semiconductor region is not formed may be formed on at least a part of a surface of the semiconductor substrate opposing the center portion in the longitudinal direction of the insulated gate.

A trench width of the center portion of the insulated gate may be wider than a trench width of each of the end portions of the insulated gate in a plan view of the semiconductor device.

A second semiconductor device disclosed in the present description comprises: a first conductivity type drift region formed in a semiconductor substrate; a second conductivity type body region formed at an upper surface of the semiconductor substrate on an upper surface side of the drift region; a first conductivity type first semiconductor region formed on a part of an upper surface of the body region; and a trench gate type insulated gate penetrating the first semiconductor region and the body region, and formed to a depth at which the insulated gate contacts the drift region. The insulated gate comprises a deep portion at a part of the insulated gate in a longitudinal direction, a depth of the deep portion being deeper than a depth of another portion of the insulated gate on a drift region side relative to the body region, and the semiconductor device further comprises a bypass portion in which the first semiconductor region is not formed, the bypass portion being formed on at least a part of a surface of the semiconductor substrate opposing the deep portion.

According to the semiconductor device described above, since the bypass portion in which the first semiconductor region is not formed is formed on at least a part of the surface of the semiconductor substrate opposing the deep portion, electrical charges concentrated in the deep portion of the insulated gate moves from the bypass portion to the upper surface side of the semiconductor substrate. As a result, an occurrence of a latchup due to the electric field concentration can be prevented. Since the trench depth continuously varies in the longitudinal direction of a single insulated gate and the local variation is small, the electric field can be changed gradually and the reduction of the effect of preventing the latchup can be suppressed.

A trench width of the deep portion of the insulated gate may be wider than a trench width of another portion of the insulated gate in a plan view of the semiconductor device.

DETAILED DESCRIPTION OF INVENTION

Figure 1:
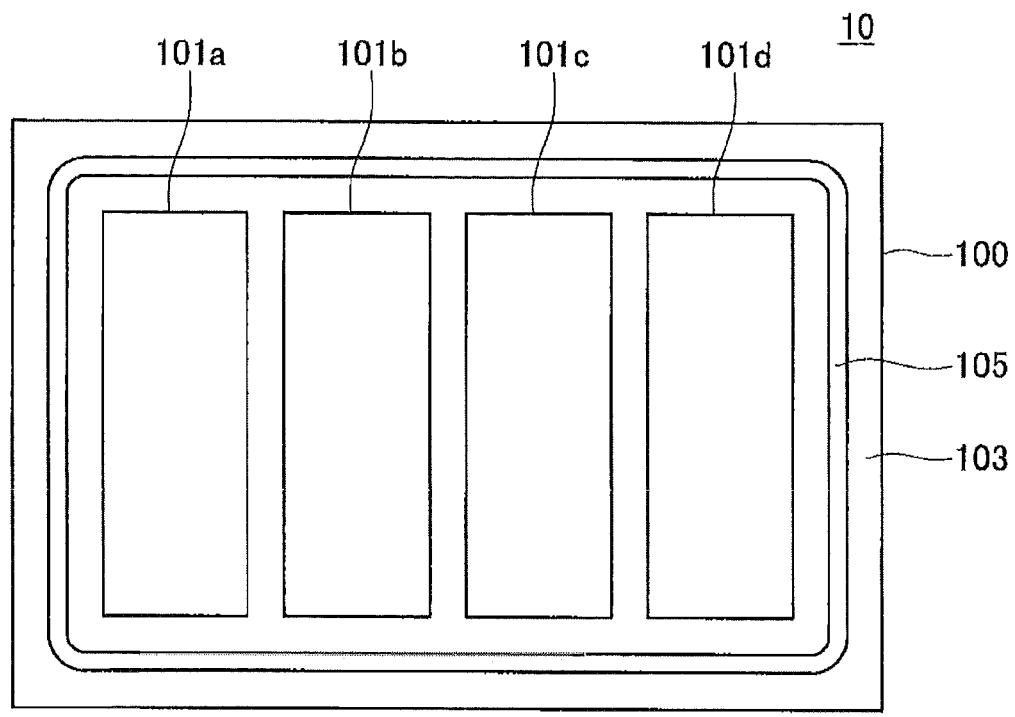
FIG. 1 is a plan view of a semiconductor device according to a first embodiment.

A first semiconductor device disclosed in the present description comprises: a first conductivity type drift region formed in a semiconductor substrate; a second conductivity type body region formed at an upper surface of the semiconductor substrate on an upper surface side of the drift region; a first conductivity type first semiconductor region formed on a part of an upper surface of the body region; and a trench gate type insulated gate penetrating the first semiconductor region and the body region, and formed to a depth at which the insulated gate contacts the drift region. A part of the insulated gate on a drift region side relative to the body region is deeper at a center portion than at both end portions in a longitudinal direction of the insulated gate. According to the first semiconductor device, an electric field concentration can be mitigated by gradually varying an electric field along the longitudinal direction of the insulated gate.

In the first semiconductor device, a shape and a depth gradient of a bottom portion of the insulated gate are not particularly limited. The bottom portion of the insulated gate may have a stepped shape, a curved shape, an inclined shape, or a combination thereof. The insulated gate favorably becomes gradually deeper from both end portions to the center portion thereof. While the center portion is favorably located at a central position or in a vicinity thereof in the longitudinal direction of the trench gate, a distance from the center portion of the trench gate to one of the end portions of the trench gate may differ from a distance from the center portion of the trench gate to the other end portion of the trench gate.

A second semiconductor device disclosed in the present description comprises: a first conductivity type drift region formed in a semiconductor substrate; a second conductivity type body region formed at an upper surface of the semiconductor substrate on an upper surface side of the drift region; a first conductivity type first semiconductor region formed on a part of an upper surface of the body region; and a trench gate type insulated gate penetrating the first semiconductor region and the body region, and formed to a depth at which the insulated gate contacts the drift region. The insulated gate comprises a deep portion at a part of the insulated gate in a longitudinal direction, a depth of the deep portion being deeper than a depth of another portion of the insulated gate on a drift region side relative to the body region, and the semiconductor device further may comprise a bypass portion in which the first semiconductor region is not formed, the bypass portion being formed on at least a part of a surface of the semiconductor substrate opposing the deep portion. Since the first semiconductor region is formed on the upper surface of the body region (in the present application, the term "body region" includes a body contact region having a same conductivity type as a body region), in the bypass portion in which the first semiconductor region is not formed, the body region is exposed at the upper surface of the semiconductor substrate. According to the second semiconductor device, electrical charges concentrated in the deep portion of the insulated gate moves from the bypass portion to the upper surface side of the semiconductor substrate. As a result, an occurrence of a latchup due to the electric field concentration can be prevented.

In the second semiconductor device, a shape and a depth gradient of a bottom portion of the insulated gate are not particularly limited. The bottom portion of the insulated gate may have a stepped shape, a curved shape, an inclined shape, or a combination thereof. The insulated gate need only comprise one portion with a shallow trench depth (a shallow portion) and one portion with a deep trench depth (a deep portion). The insulated gate may comprise a plurality of shallow portions and a plurality of deep portions. In a case in which the bottom portion of the insulated gate has a curved shape, an inclined shape, or the like and a trench depth varies gradually along the longitudinal direction of the insulated gate, the first semiconductor region is favorably formed at a position separated by a distance of 0.03D or greater in the longitudinal direction of the insulated gate from a deepest position in the deep portion, where a distance D denotes a depth of the deepest position in the deep portion of the insulated gate from the upper surface of the semiconductor substrate. In the case in which the insulated gate comprises the plurality of shallow portions and the plurality of deep portions, the first semiconductor region is favorably formed at the position separated by the distance of 0.03D or greater in the longitudinal direction of the insulated gate from the deepest position in the respective deep portions.

The first semiconductor device may further comprise characteristics of the second semiconductor device. Specifically, the first semiconductor device may further comprise a bypass portion in which the first semiconductor region is not formed, the bypass portion being formed on at least a part of a surface of the semiconductor substrate opposing the center portion in the longitudinal direction of the insulated gate. In other words, in the second semiconductor device, a part of the insulated gate on a drift region side relative to the body region may be deeper at a center portion than at both end portions in a longitudinal direction of the insulated gate. Since an electric field can be gradually varied along the longitudinal direction of the insulated gate and electrical charges can be moved from the bypass portion formed on a surface of the semiconductor substrate opposing the center portion in the longitudinal direction of the insulated gate that is a deep portion of the insulated gate to the upper surface side of the semiconductor substrate, an electric field concentration can be mitigated and an occurrence of a latchup can be prevented.

In the second semiconductor device, in a case in which the insulated gate becomes gradually deeper from both end portions to the center portion of the insulated gate, a shape and a depth gradient of the bottom portion of the insulated gate are not particularly limited. The bottom portion of the insulated gate may have a stepped shape, a curved shape, an inclined shape, or a combination thereof.

The first semiconductor device and the second semiconductor device may be designed such that the deeper a trench depth of the insulated gate, the wider a trench width (a length in a transverse direction in a plan view of the semiconductor devices) of the insulated gate. In the case of the first semiconductor device, a trench width of the center portion of the insulated gate may be wider than a trench width of each of the end portions of the insulated gate. In the case of the second semiconductor device, a trench width of the deep portion of the insulated gate may be wider than a trench width of another portion of the insulated gate.

When manufacturing a semiconductor device designed in this manner, by performing patterning in a shape according to a plan view of the semiconductor device and then performing trench etching in a process of manufacturing the semiconductor device, a portion with a wider trench width can be given a deeper trench depth. Multi-stage trench etching need not be performed in order to vary a trench depth in the longitudinal direction of the insulated gate, and a trench depth in the longitudinal direction can be varied by performing trench etching only a few times.

A constitution of the first semiconductor device need only be included in at least a part of a semiconductor device. In a similar manner, a constitution of the second semiconductor device need only be included in at least a part of a semiconductor device. In addition, a single semiconductor device may separately comprise a constitution according to the first semiconductor device and a constitution according to the second semiconductor device. For example, a single semiconductor device may comprise a plurality of first and second cell regions, wherein the first cell region may comprise a constitution according to the first semiconductor device such as an insulated gate, and a second cell region may comprise a constitution according to the second semiconductor device such as an insulated gate and a first semiconductor region.

The first semiconductor device and the second semiconductor device according to the present application need only be a trench gate type semiconductor device. Trench gate type semiconductor devices include MOS type semiconductor devices such as an IGBT and a MOSFET. In a case in which the first semiconductor device or the second semiconductor device is an IGBT, the first semiconductor region is an emitter region, and a collector region is further provided on a lower surface side of a semiconductor substrate. In a case in which the first semiconductor device or the second semiconductor device is a MOSFET, the first semiconductor region is a source region, and a drain region is further provided on a lower surface side of a semiconductor substrate. Furthermore, a shape or an arrangement of an insulated gate in a plan view of the semiconductor device is not particularly limited. A plurality of approximately linear insulated gates may be arranged parallel to each other, or a curved-shaped or a coil-shaped insulated gate may be adopted. Insulated gates may intersect each other. While an IGBT is exemplified and described as an example of a semiconductor device in the following embodiments and modifications, the present invention is not limited thereto and can be similarly applied to another trench gate type semiconductor device such as an MOSFET. For example, a description regarding an installation position of an emitter layer of an IGBT is also applicable to an installation position of a source layer of an MOSFET.

[First Embodiment]

Figure 2:
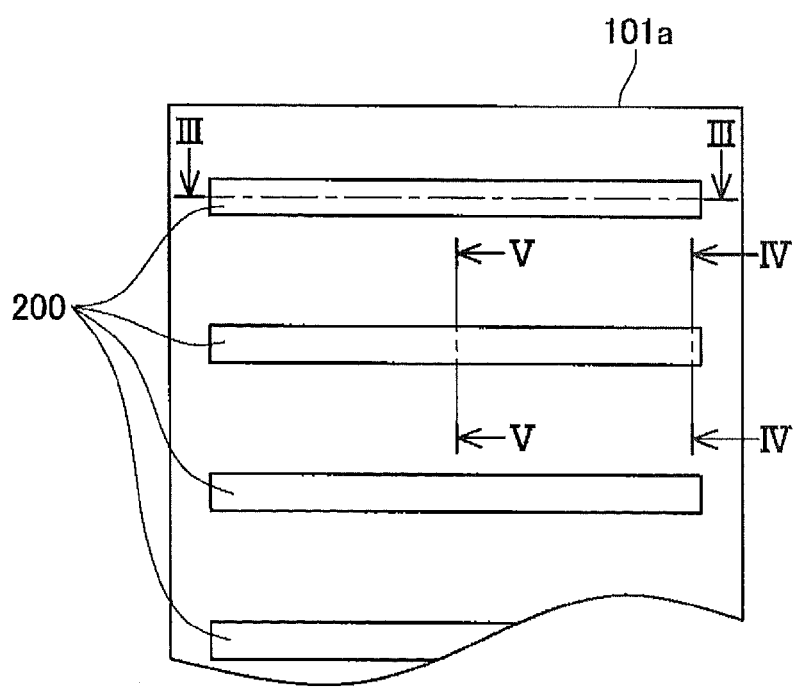
FIG. 2 is an enlarged view of a part of a cell region shown in the plan view of the semiconductor device of FIG. 1.

As shown in FIG. 1, a semiconductor device 10 according to a first embodiment comprises a semiconductor substrate 100 including cell regions 101a to 101d and a non-cell region 103. The cell regions 101a to 101d are arranged at a center portion of the semiconductor substrate 100, and a peripheral termination portion 105 that surrounds the cell regions 101a to 101d is formed in the non-cell region 103. As shown in FIG. 2, a plurality of trench gates 200 is formed in the cell region 101a. The plurality of trench gates 200 is linear in a plan view of the semiconductor device 10, and each of the trench gates 200 has a same size and a same shape. The plurality of trench gates 200 is arranged so that longitudinal directions of the trench gates are parallel to each other. Although not shown, pluralities of trench gates similar to those in the cell region 101a are also formed in the cell regions 101b to 101d.

Figure 3:
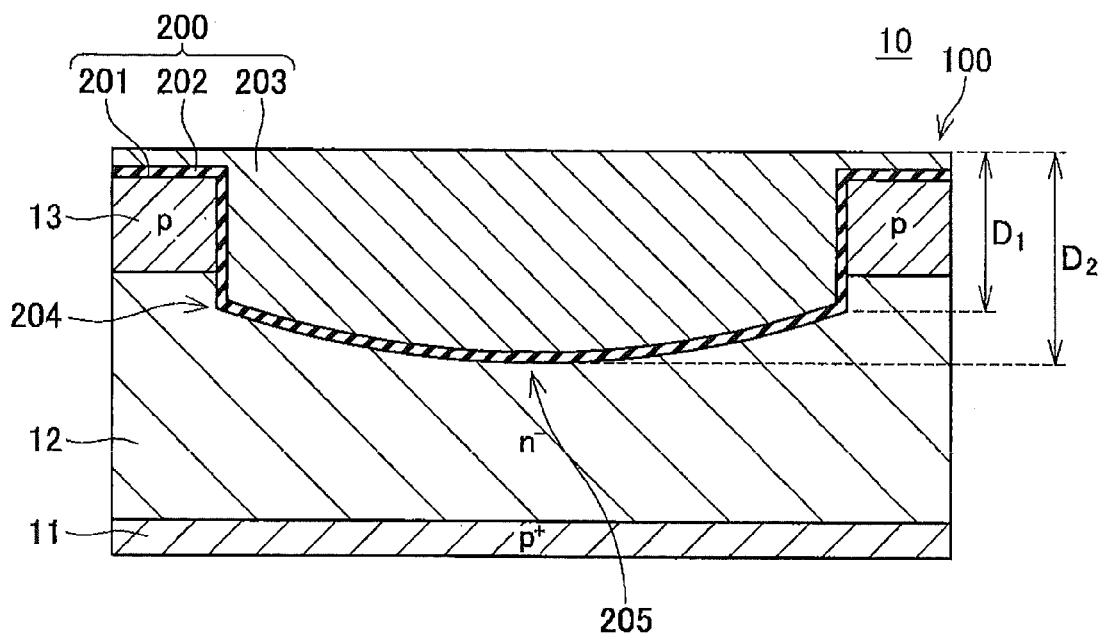
FIG. 3 is a cross-sectional view taken along line in FIG. 2.
Figure 4:
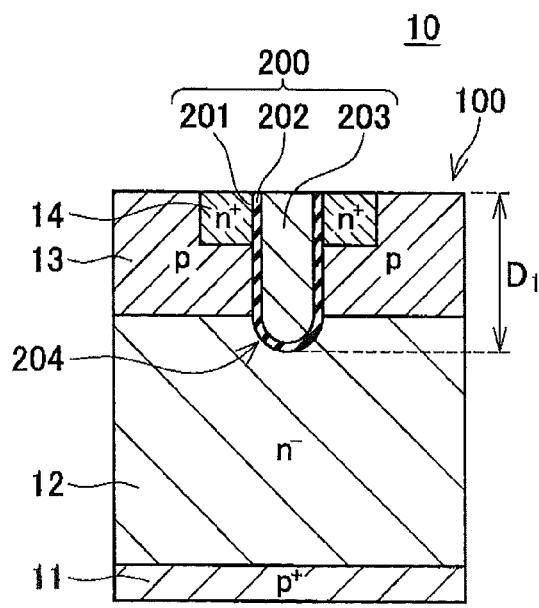
FIG. 4 is a cross-sectional view taken along line IV-IV in FIG. 2.
Figure 5:
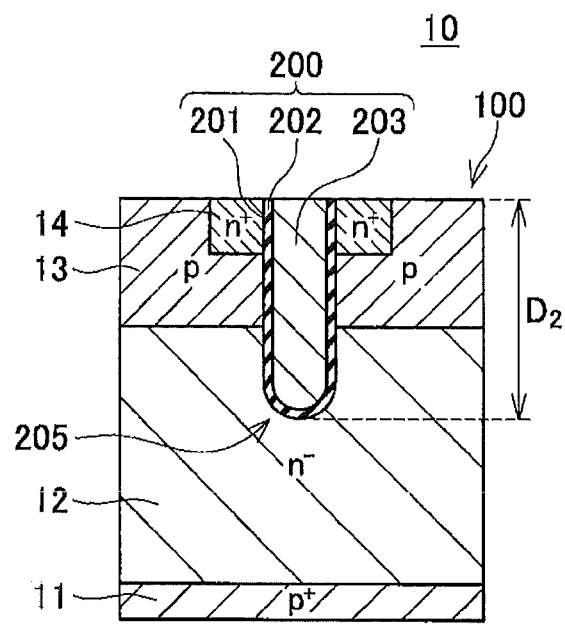
FIG. 5 is a cross-sectional view taken along line V-V in FIG. 2.

As shown in FIGS. 3 to 5, a trench gate type IGBT is formed in the cell regions 101a to 101d of the semiconductor device 10. The semiconductor substrate 100 comprises a p⁺ type collector layer 11, an $n^{31}$ type drift layer 12, a p type body layer 13, and an n⁺ type emitter layer 14. The trench gate 200 penetrates the body layer 13 and the emitter layer 14 from an upper surface side of the semiconductor substrate 100 and reaches the drift layer 12. The trench gate 200 comprises a trench 201, an insulating film 202 formed on an inner wall of the trench 201, and an gate electrode 203 which is covered by the insulating film 202 and which fills an inside of the trench 201. The emitter layer 14 extends along a longitudinal direction of the trench gate 200 and is in contact with the insulating film 202 of the trench gate 200.

A trench depth of the trench gate 200 varies along the longitudinal direction thereof. Since the body layer 13 is formed at an approximately constant depth from an upper surface of the semiconductor substrate 100, a depth of a portion of the trench gate 200 on a side of the drift layer 12 relative to the body layer 13 varies along the longitudinal direction of the trench gate 200. A portion of the trench gate 200 in contact with the drift layer 12 is shallowest on both end sides in the longitudinal direction (a shallowest portion 204) and deepest at a center portion in the longitudinal direction (a deepest portion 205). The trench depth of the trench gate 200 becomes gradually deeper from the shallowest portion 204 to the deepest portion 205 in an approximately arc-like pattern. The shallowest portion 204 has a depth of $D_1$ from the upper surface of the semiconductor substrate 100, and the deepest portion 205 has a depth of $D_2$ from the upper surface of the semiconductor substrate 100. A difference between $D_2$ and $D_1$ favorably satisfies $D_2-D_1 \geq 0.03 D_2$.

As shown in FIGS. 3 to 5, in the semiconductor device 10, an entirety of the trench gate 200 in the longitudinal direction thereof from one of the end portions to the other end portion penetrates the body layer 13 and reaches the drift layer 12. The depth $D_2$ of the deepest portion 205 that is the center portion of the trench gate 200 is deeper than the depth $D_1$ of the shallowest portion 204 of the both end portions of the trench gate 200, and the depth of the portion of the deepest portion 205 on the side of the drift layer 12 relative to the body layer 13 is deeper than the portion of the shallowest portion 204 on the side of the drift layer 12 relative to the body layer 13. Therefore, an electric field concentration can be mitigated by continuously and gradually varying an electric field along the longitudinal direction of the trench gate 200. In a case in which a plurality of trench gates with different trench depths is arranged at intervals in a transverse direction of the trench gates so that longitudinal directions of the respective trench gates are approximately parallel to each other as is conventional, an electric field can be varied in the transverse direction of the trench gates. However, since the trench gates are arranged at intervals, the electric field cannot be continuously and gradually varied. In addition, it is difficult to adjust a state of the variation of the electric field by adjusting depths of the respective trenches. With the trench gate according to the present application, since the electric field can be continuously varied in the longitudinal direction, the electric field concentration can be mitigated more effectively than with the conventional technique of varying the electric field in the transverse direction of the trench gates, and the state of the variation of the electric field can be adjusted more readily. In the first embodiment, as shown in FIG. 3, since the trench depth of the trench gate 200 becomes gradually deeper in the approximately arc-like pattern from the shallowest portions 204 to the deepest portion 205, the electric field varies more gradually in the longitudinal direction of the trench gate 200, and a greater effect of mitigating the electric field concentration can be produced.

(Modifications)

FIGS. 6 to 9 show forms of trench gates according to modifications of the first embodiment, in which semiconductor devices according to the modifications are shown by a same cross section as FIG. 3. In each of FIGS. 6 to 9, a part of the trench gate on a drift layer side relative to a body layer is deeper at a center portion than at both end portions in a longitudinal direction. Therefore, even according to FIGS. 6 to 9, an electric field concentration can be mitigated by gradually varying an electric field along the longitudinal direction of the trench gate. Moreover, since the modifications shown in FIGS. 6 to 9 share a same constitution as the semiconductor device 10 according to the first embodiment with the exception of having different trench gate shapes, overlapping descriptions will be omitted.

Figure 6:
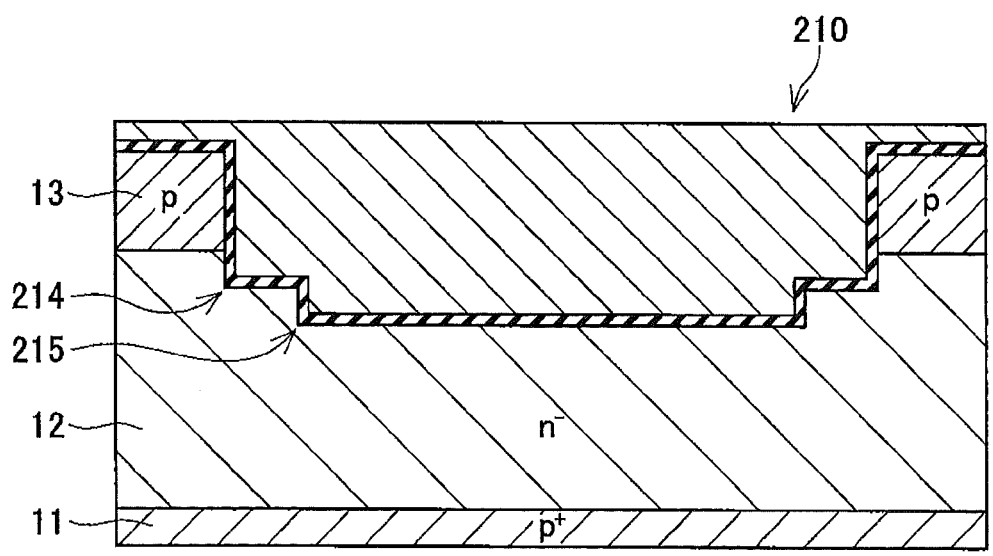
FIG. 6 is a cross-sectional view of a semiconductor device according to a modification.
Figure 7:
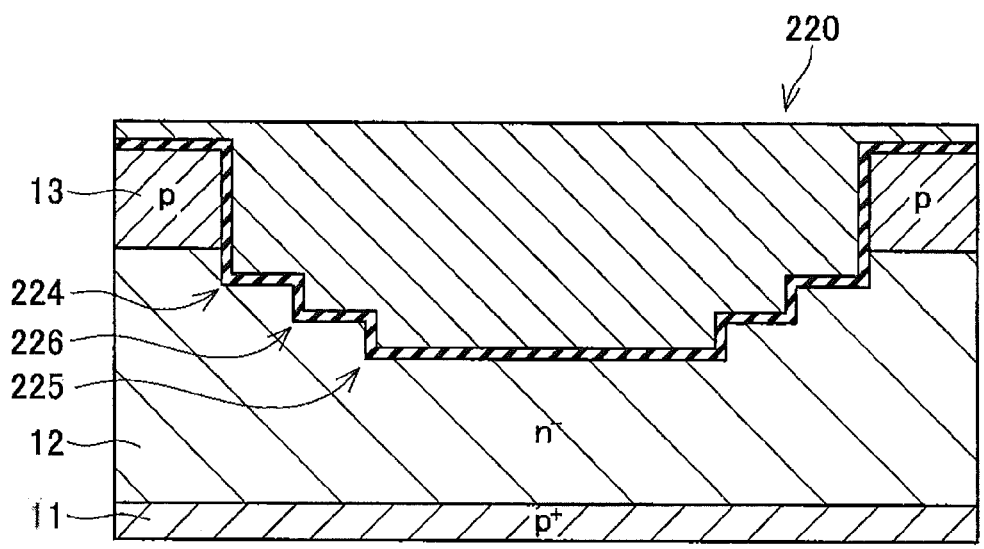
FIG. 7 is a cross-sectional view of a semiconductor device according to a modification.

For example, as shown in FIGS. 6 and 7, the semiconductor device 10 may comprise a trench gate 210 or 220 having a depth that differs in a stepped pattern in the longitudinal direction. As shown in FIG. 6, a shallowest portion 214 and a deepest portion 215 of the trench gate 210 respectively have a flat shape with an approximately constant depth, and the flat shallowest portion 214 and the flat deepest portion 215 combine to form a stepped bottom portion of the trench gate 210. The deepest portion 215 is formed on a central side of the trench gate 210, and the shallowest portion 214 is formed on both end sides of the deepest portion 215. As shown in FIG. 7, the semiconductor device 10 may comprise the trench gate 220 in which an intermediate portion 226 is further formed between a deepest portion 225 and a shallowest portion 224 on both end sides of the deepest portion 225. A trench depth of the intermediate portion 226 is deeper than a trench depth of the shallowest portion 224 and shallower than a trench depth of the deepest portion 225. While the intermediate portion 226 shown in FIG. 7 has a single step, two or more steps may alternatively be formed.

Figure 8:
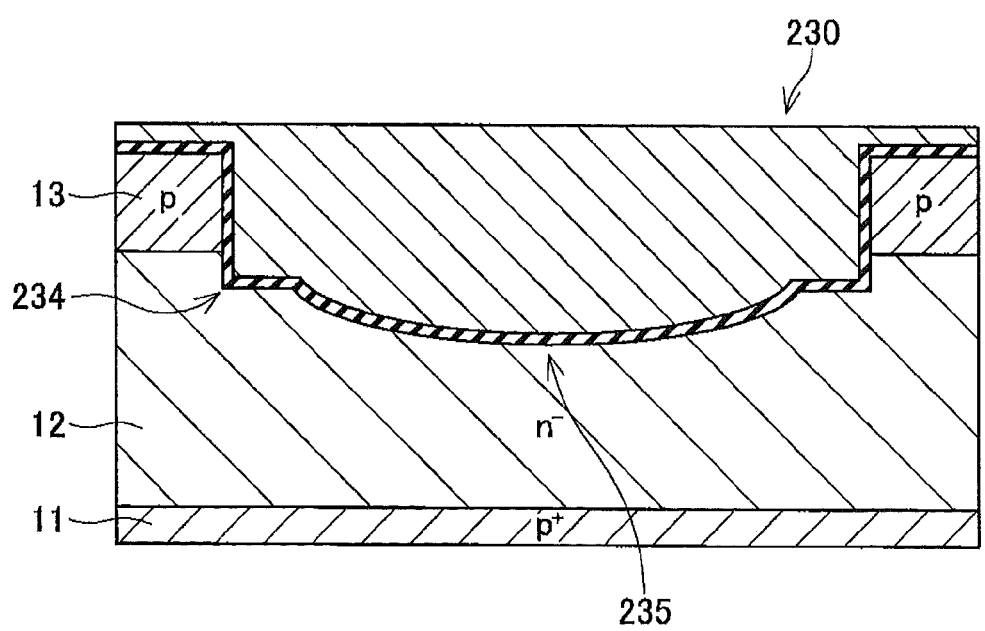
FIG. 8 is a cross-sectional view of a semiconductor device according to a modification.

In addition, for example, as shown in FIG. 8, the semiconductor device 10 may comprise a trench gate 230 having a flat portion and an arc-shaped portion in a trench bottom portion. The trench gate 230 comprises a shallowest portion 234 having a flat trench bottom portion at both end sides of the trench gate 230 and an arc-shaped trench bottom portion on a central side. A trench depth of the arc-shaped trench bottom portion becomes deeper in an arc-like pattern from the shallowest portion 234 to the deepest portion 235.

Figure 9:
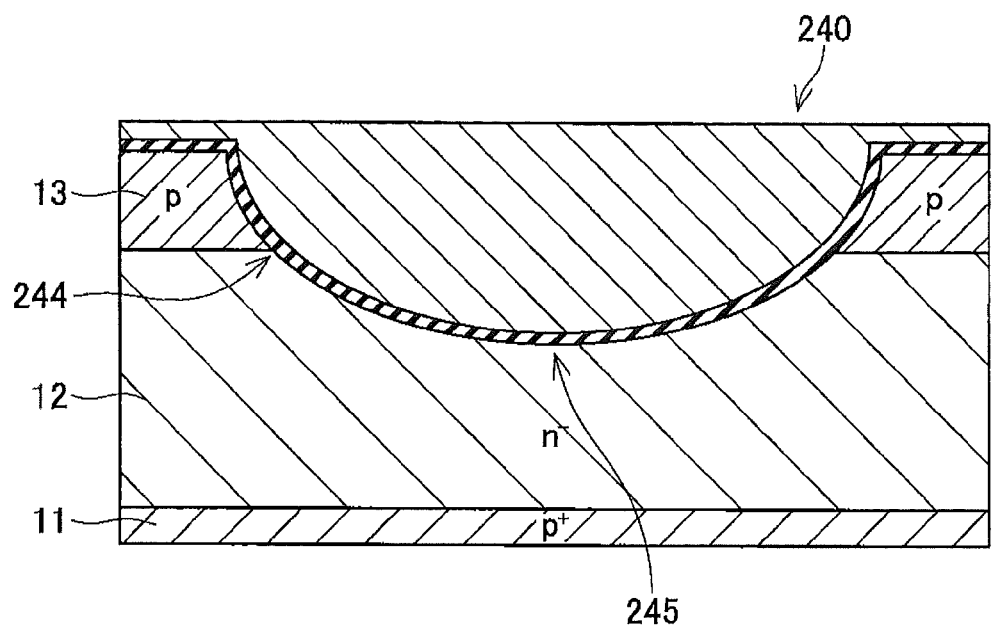
FIG. 9 is a cross-sectional view of a semiconductor device according to a modification.

Furthermore, for example, as shown in FIG. 9, the semiconductor device 10 may comprise a trench gate 240 having an arc-shaped trench bottom portion which is continuous from an upper surface side of a body layer 13 (an opposite side to a drift layer 12). Each end of a portion that penetrates the body layer 13 and reaches the drift layer 12 of the trench gate 240 is a shallowest portion 244, and a deepest portion 245 is formed in a center portion of the trench gate 240.

Figure 10:
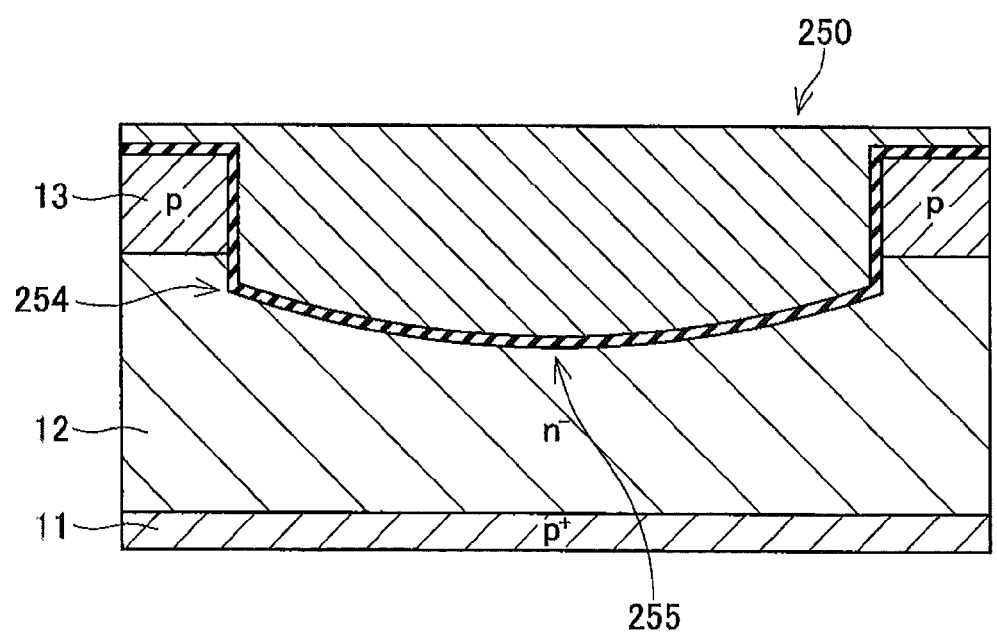
FIG. 10 is a cross-sectional view of a semiconductor device according to a modification.
Figure 11:
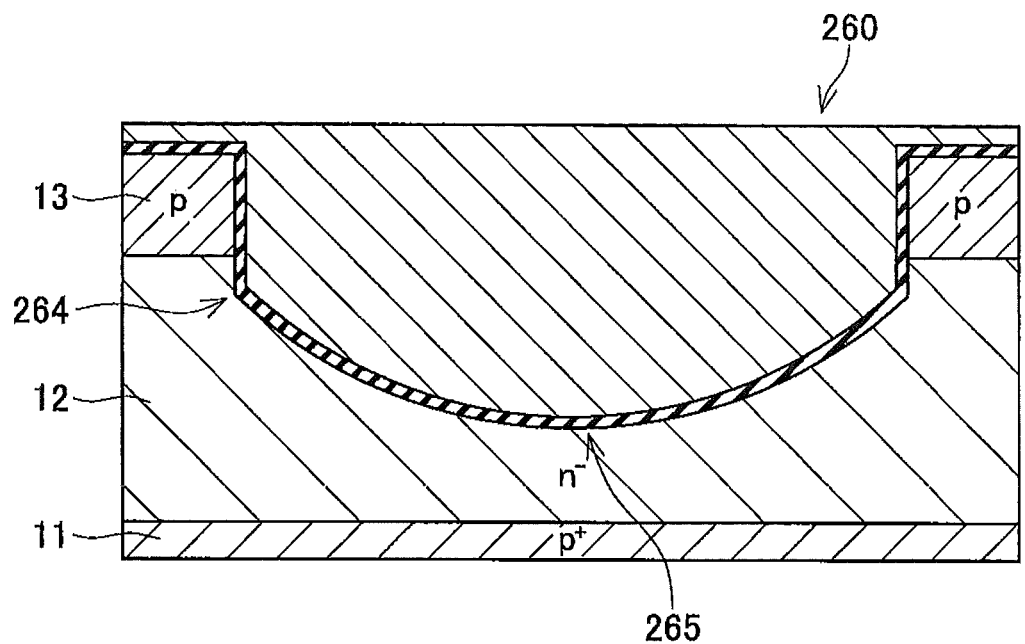
FIG. 11 is a cross-sectional view of a semiconductor device according to a modification.

While a case in which all of the trench gates have a same configuration has been exemplified and described in the first embodiment, trench gates with different configurations may coexist in a single semiconductor device. For example, a trench gate 250 shown in FIG. 10 may be formed in the cell region 101a and a trench gate 260 shown in FIG. 11 may be formed in the cell regions 101b to 101d. A comparison of the trench gate 250 and the trench gate 260 shows that while a shallowest portion 254 and a shallowest portion 264 have a same trench depth, a deepest portion 265 has a deeper trench depth than a deepest portion 255. In addition, trench gates with different configurations may coexist in a single cell region. For example, the trench gate 250 and the trench gate 260 may coexist in the cell region 101a. Moreover, since the modifications shown in FIGS. 10 and 11 share a same constitution as the semiconductor device 10 according to the first embodiment with the exception of having different trench gate shapes, overlapping descriptions will be omitted.

In addition, the semiconductor device 10 may partially comprise a trench gate that does not satisfy a condition that a depth of a portion on a side of a drift layer 12 relative to a body layer 13 is deeper at a center portion than at both end portions in a longitudinal direction.

Furthermore, the semiconductor device 10 may comprise a trench gate 300 such as those shown in FIGS. 12 to 15. In the trench gate 300, the deeper a trench depth is, the wider a trench width (a length in a transverse direction in a plan view of the semiconductor device). A trench width at a center portion of the trench gate 300 is wider than a trench width at both end portions of the trench gate 300 in a plan view of the semiconductor device. The trench width of the trench gate 300 gradually widens in an approximately arc-like pattern from a shallowest portion 304 to a deepest portion 305 of the trench gate 300 and, accordingly, the trench depth of the trench gate 300 gradually becomes deeper in an approximately arc-like pattern from the shallowest portion 304 to the deepest portion 305. The center portion with the wide trench width of the trench gate 300 has a deeper trench depth than the both end portions with the narrow trench width.

Figure 12:
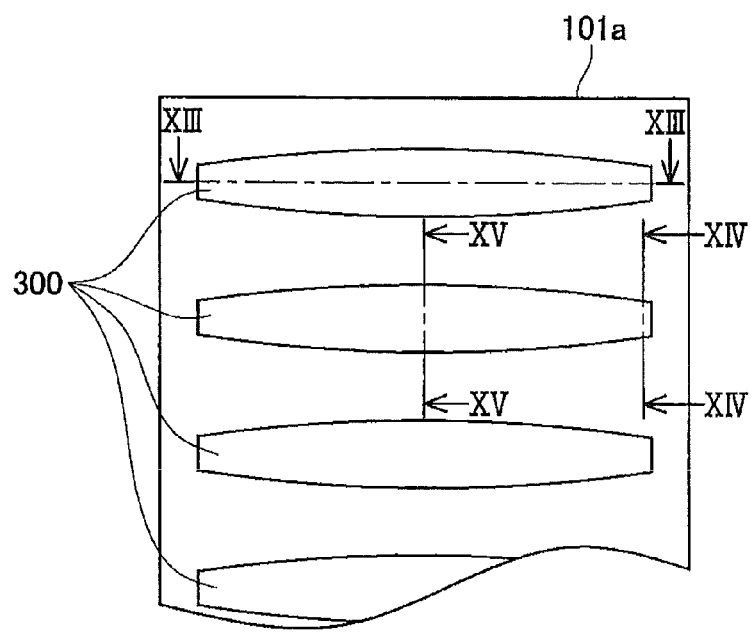
FIG. 12 is a plan view of a semiconductor device according to a modification showing an enlargement of a part of a cell region.
Figure 13:
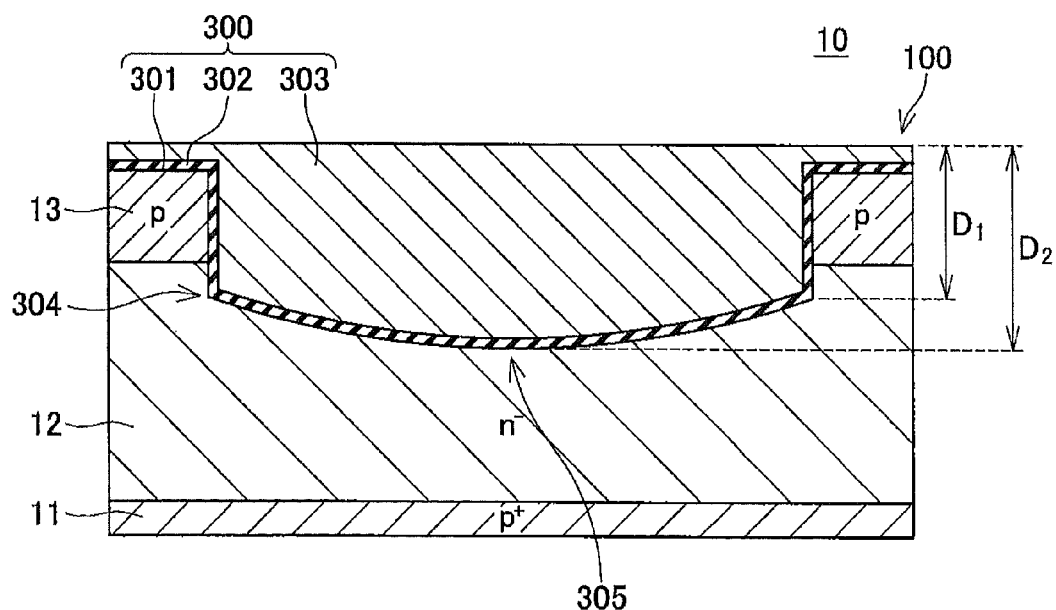
FIG. 13 is a cross-sectional view taken along line XIII-XIII in FIG. 12.
Figure 14:
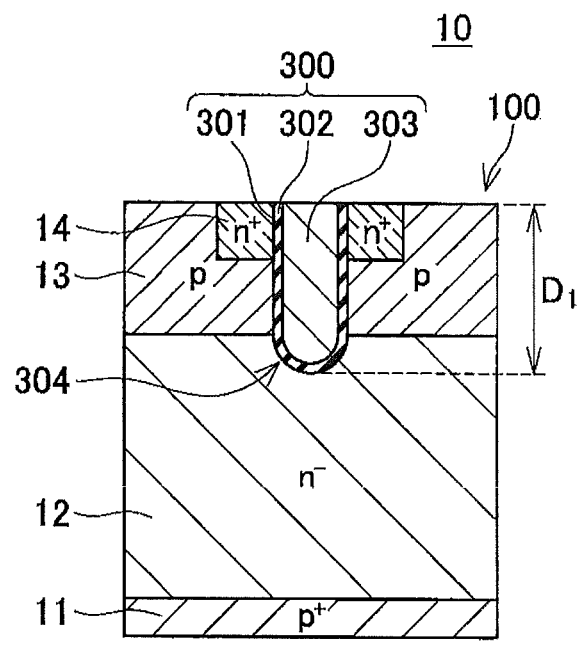
FIG. 14 is a cross-sectional view taken along line XIV-XIV in FIG. 12.
Figure 15:
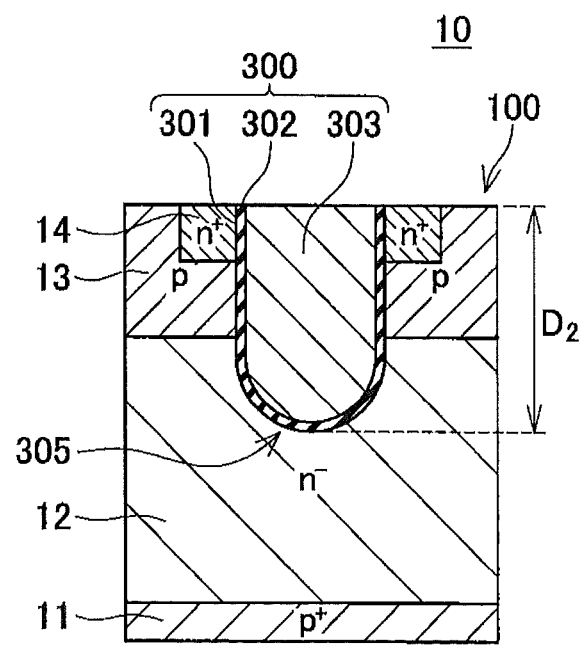
FIG. 15 is a cross-sectional view taken along line XV-XV in FIG. 12.
Figure 16:
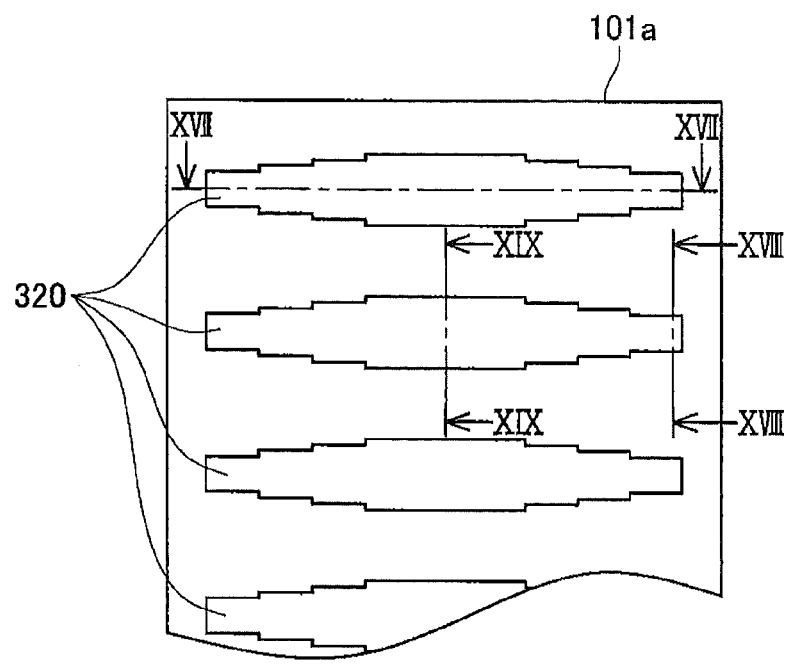
FIG. 16 is a plan view of a semiconductor device according to a modification showing an enlargement of a part of a cell region.
Figure 17:
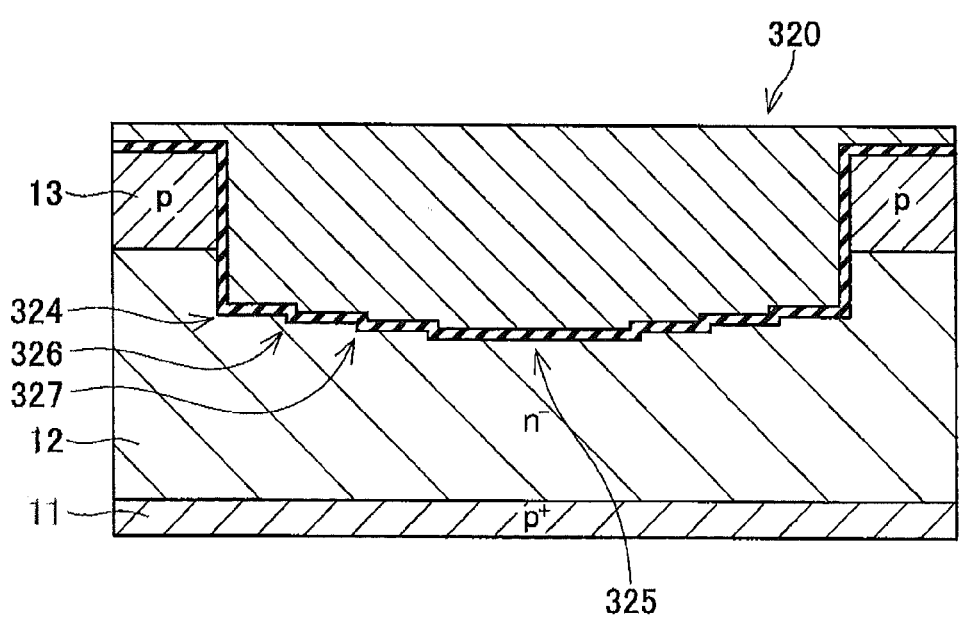
FIG. 17 is a cross-sectional view taken along line XVII-XVII in FIG. 16.
Figure 18:
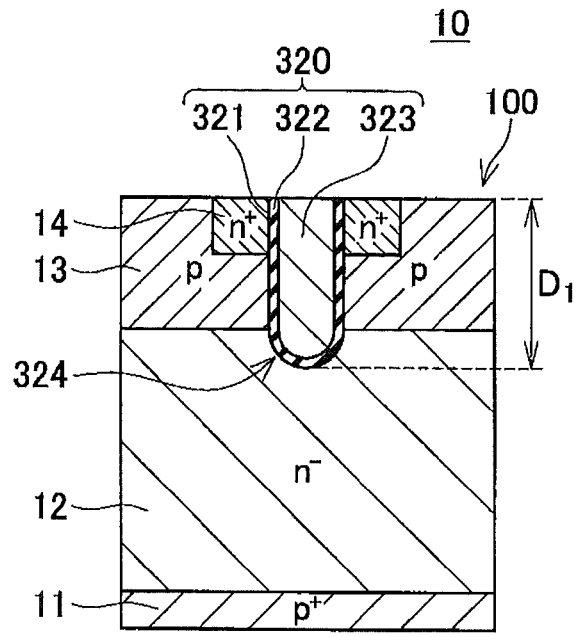
FIG. 18 is a cross-sectional view taken along line XVIII-XVIII in FIG. 16.
Figure 19:
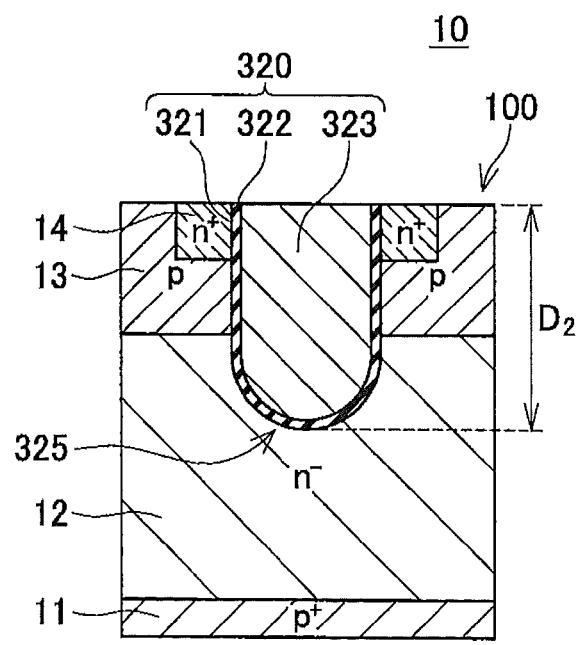
FIG. 19 is a cross-sectional view taken along line XIX-XIX in FIG. 16.

In a process of manufacturing the semiconductor device, by performing patterning so as to form the trench gate having the wide trench width at the center portion as shown in FIG. 12 and the like and then performing trench etching, the closer to the center portion of the trench gate with the wider trench width, the deeper the trench depth. As shown in FIGS. 12 to 15, by designing the trench gate so that the deeper the trench depth of a portion, the wider the trench width of the portion, the trench depth in the longitudinal direction can be varied by performing only a small number of trench etching operations.

While cases of the approximately arc-shaped trench bottom portion have been exemplified and described with reference to FIGS. 12 to 15, even in cases of a stepped trench bottom portion such as shown in FIGS. 16 to 19, by designing a trench gate so that the deeper a trench depth of a portion, the wider a trench width of the portion, a trench depth in a longitudinal direction can be varied by performing only a small number of trench etching operations. A trench depth and a trench width of a trench gate 320 vary in a stepped pattern. The trench width gradually widens in the stepped pattern from a shallowest portion 324 to a deepest portion 325 of the trench gate 320, and the trench depth of the trench gate 320 gradually becomes deeper in the stepped pattern from the shallowest portion 324 to the deepest portion 325. In a similar manner, even in a case of a trench bottom portion with a shape other than the arc shape or the stepped shape, by designing a trench gate so that the deeper a trench depth of a portion, the wider a trench width of the portion, a trench depth in a longitudinal direction can be varied by performing only a small number of trench etching operations. Moreover, since the modifications shown in FIGS. 12 to 19 share a same constitution as the semiconductor device 10 according to the first embodiment with the exception of having different trench gate shapes, overlapping descriptions will be omitted.

[Second Embodiment]

Figure 20:
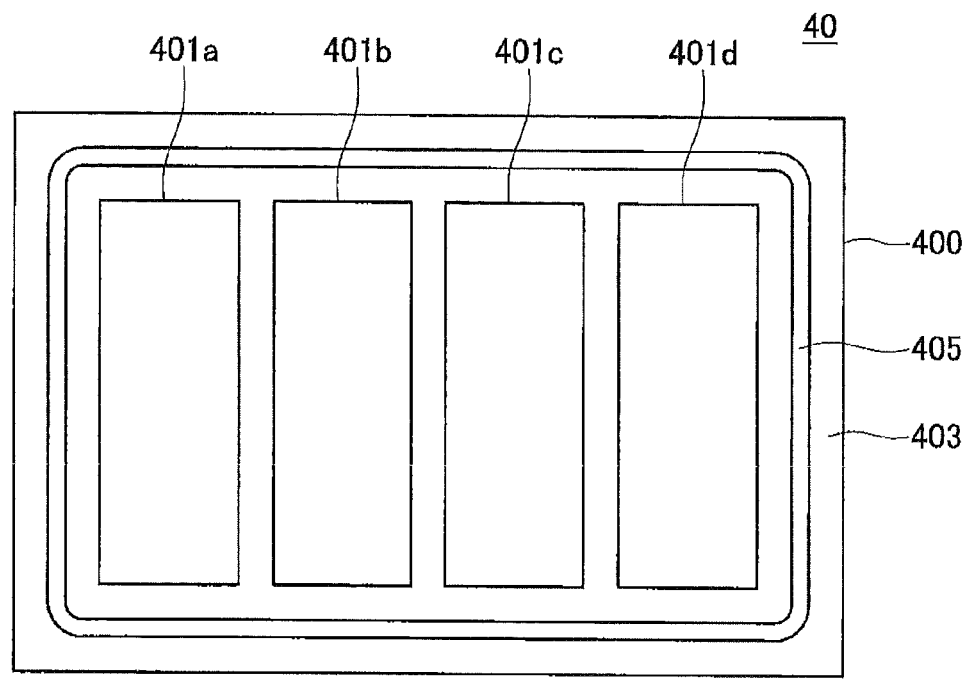
FIG. 20 is a plan view of a semiconductor device according to a second embodiment.
Figure 21:
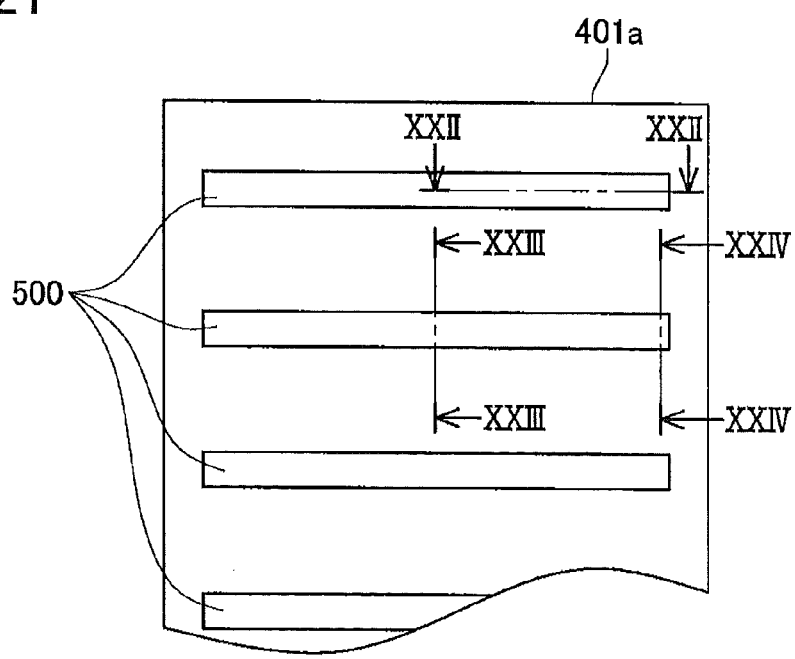
FIG. 21 is an enlarged view of a part of a cell region shown in the plan view of the semiconductor device of FIG. 20.

As shown in FIG. 20, a semiconductor device 40 according to a second embodiment comprises a semiconductor substrate 400 including cell regions 401a to 401d and a non-cell region 403. The cell regions 401a to 401d are arranged at a center portion of the semiconductor substrate 400, and a peripheral termination portion 405 that surrounds the cell regions 401a to 401d is formed in the non-cell region 403. As shown in FIG. 21, a plurality of trench gates 500 is formed in the cell region 401a. All of the trench gates 500 have a same size and a same shape, and are arranged so that longitudinal directions of the trench gates 500 are parallel to each other. Although not shown, pluralities of trench gates similar to those in the cell region 401a are also formed in the cell regions 401b to 401d.

Figure 22:
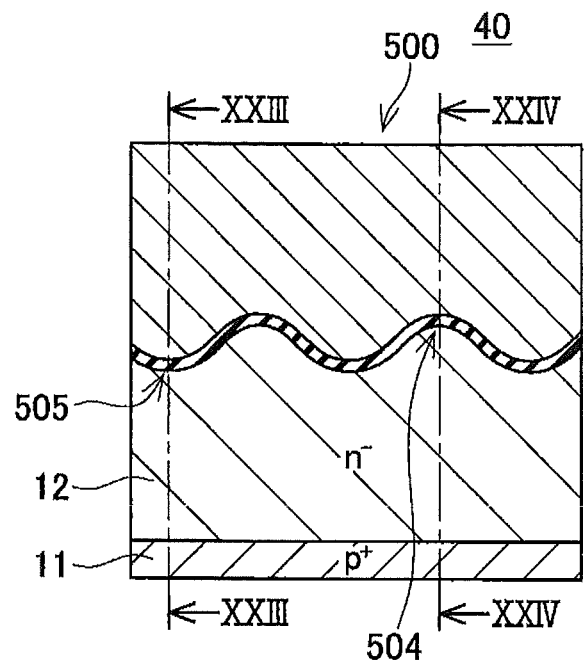
FIG. 22 is a cross-sectional view taken along line XXII-XXII in FIG. 21.
Figure 23:
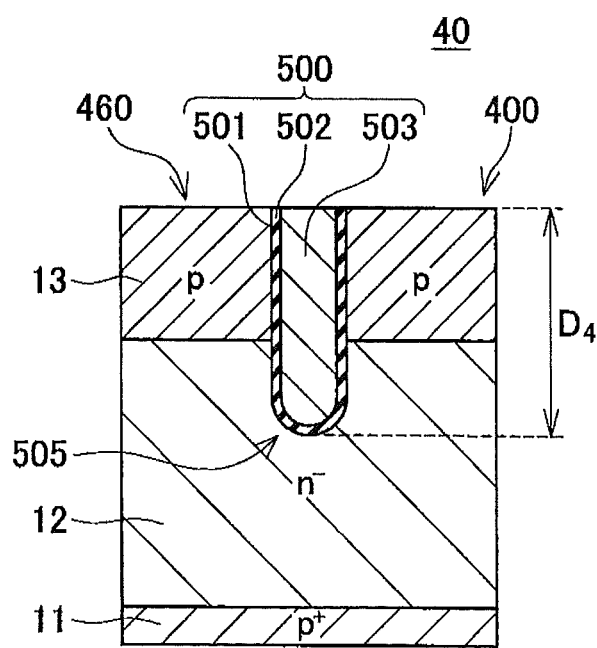
FIG. 23 is a cross-sectional view taken along line in FIG. 21.
Figure 24:
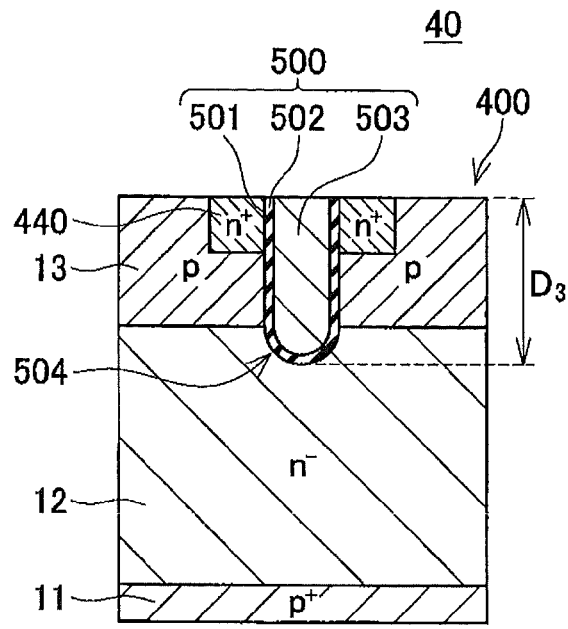
FIG. 24 is a cross-sectional view taken along line XXIV-XXIV in FIG. 21.

As shown in FIGS. 22 to 24, a trench gate type IGBT is formed in the cell regions 401a to 401d of the semiconductor device 40. The semiconductor substrate 400 comprises a $p^+$ type collector layer 11, an if type drift layer 12, a p type body layer 13, and an $n^+$ type emitter layer 440. The trench gate 500 penetrates the body layer 13 and the emitter layer 440 from an upper surface side of the semiconductor substrate 400 and reaches the drift layer 12. The trench gate 500 comprises a trench 501, an insulating film 502 formed on an inner wall of the trench 501, and an gate electrode 503 which is covered by the insulating film 502 and which fills an inside of the trench 501. The emitter layer 440 is partially formed along the longitudinal direction of the trench gate 500. The emitter layer 440 is in contact with the insulating film 502 of the trench gate 500.

A depth of the trench gate 500 varies along the longitudinal direction thereof. A depth of a portion of the trench gate 500 that reaches the drift layer 12 varies approximately cyclically in a curved pattern in the longitudinal direction, and comprises a plurality of shallow portions 504 with a shallow trench depth and a plurality of deep portions 505 with a deep trench depth. The shallow portions 504 and the deep portions 505 are alternately arranged in the longitudinal direction of the trench gate 500. As shown in FIGS. 23 and 24, while the emitter layer 440 is formed on the surface of the semiconductor substrate 400 opposing the shallow portion 504 (an upper surface side of the body layer 13), the surface of the semiconductor substrate 400 opposing the deep portion 505 constitutes a bypass portion 460 in which the emitter layer 440 is not formed.

Figure 25:
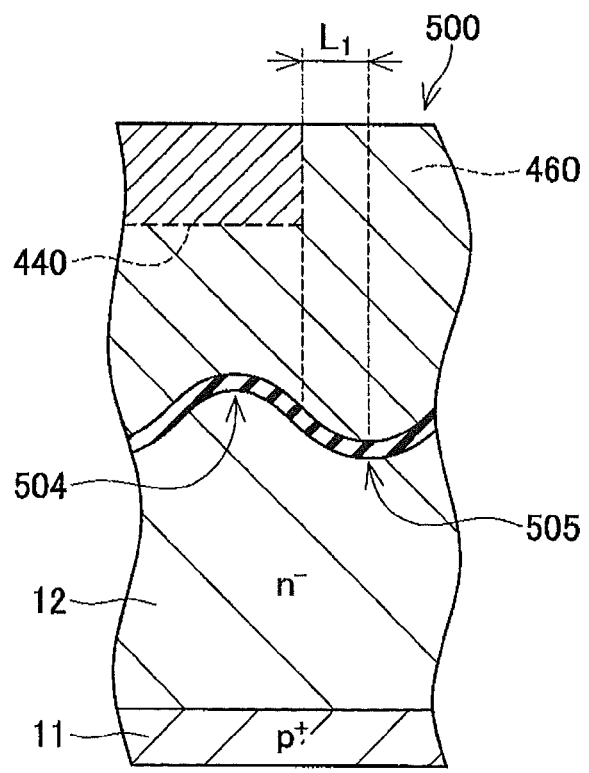
FIG. 25 is an enlarged view of a part of the cross-sectional view of FIG. 22.

FIG. 25 is a diagram which illustrates a positional relationship among the shallow portions 504, the deep portions 505, and the emitter layer 440 along the longitudinal direction of the trench gate 500 and which shows a projection of a position of the emitter layer 440 along the longitudinal direction on a cross section of the semiconductor device 40 shown in FIG. 22. As shown in FIG. 25, the emitter layer 440 is formed at a position separated by a distance of $L_1$ or greater in the longitudinal direction of the trench gate 500 from a deepest position of the deep portion 505.

A shallowest position in the shallow portion 504 has a depth of $D_3$ from the upper surface of the semiconductor substrate 400, and the deepest position in the deep portion 505 has a depth of $D_4$ from the upper surface of the semiconductor substrate 400. The distance $L_1$ favorably satisfies $L_1 \geq 0.03D_4$ with respect to the depth $D_4$ of the deepest position in the deep portion 505. In addition, a difference between $D_4$ and $D_3$ favorably satisfies $D_4 - D_3 \geq 0.03D_4$.

As shown in FIGS. 22 to 25, in the semiconductor device 40, an entirety of the trench gate 500 in the longitudinal direction thereof from one of the end portions to the other of the end portions penetrates the body layer 13 and reaches the drift layer 12. The trench gate 500 comprises the shallow portion 504 and the deep portion 505, and the bypass portion 460 in which the emitter layer 440 is not formed is provided on at least a part of the surface of the semiconductor substrate opposing the deep portion 505. Therefore, an electric field is likely to concentrate in a trench bottom portion of the deep portion 505, while an electric field concentration is less likely to occur in a trench bottom portion of the shallow portion 504. The body layer 13 is formed on the surface of the semiconductor substrate opposing the deep portion 505, and since the body layer 13 is the bypass portion 460 in which the emitter layer 440 is not formed, electric charges concentrated in the deep portion 505 can move from the bypass portion 460 to the upper surface side of the semiconductor substrate. As a result, an occurrence of a latchup due to the electric field concentration can be prevented. Meanwhile, since the emitter layer 440 is formed on the surface of the semiconductor substrate opposing the shallow portion 504, a function as an element of the semiconductor device 40 can be secured. The depth of the portion of the trench gate 500 that reaches the drift layer 12 varies approximately cyclically in the curved pattern in the longitudinal direction and, accordingly, the emitter layer 440 and the bypass portion 460 are alternately arranged. Consequently, a local electric field concentration at a part of the trench gate 500 in the longitudinal direction can be suppressed.

(Modifications)

FIGS. 26 to 29 show configurations of a trench gate according to modifications of the second embodiment, in which semiconductor devices according to the modifications are shown by a same cross section as FIG. 22. In a similar manner to FIG. 25, projections of an emitter layer along a longitudinal direction are shown. In FIGS. 26 to 29, a trench gate comprises a deep portion at a part of the insulated gate in a longitudinal direction, a depth of the deep portion being deeper on a drift region side relative to the body region of the trench gate, and a bypass portion in which the emitter layer is not formed is provided on at least a part of a surface of the semiconductor substrate opposing the deep portion. Therefore, even with FIGS. 26 to 29, electric charges concentrated in the deep portions of the trench gate can be moved from the bypass portions to an upper surface of the semiconductor substrate. As a result, an effect of suppressing an occurrence of a latchup due to an electric field concentration can be produced. Moreover, in the modifications shown in FIGS. 26 to 29, a shape of the trench gate and a corresponding arrangement of the emitter layer and the bypass portion differ from those of the second embodiment. Since a constitution is otherwise similar to that of the semiconductor device 40 according to the second embodiment, overlapping descriptions will be omitted.

Figure 26:
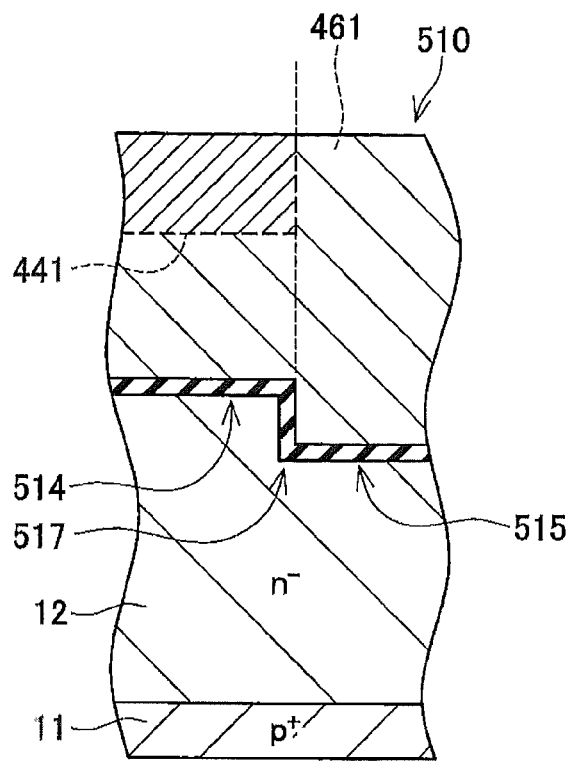
FIG. 26 is a cross-sectional view of a semiconductor device according to a modification.
Figure 27:
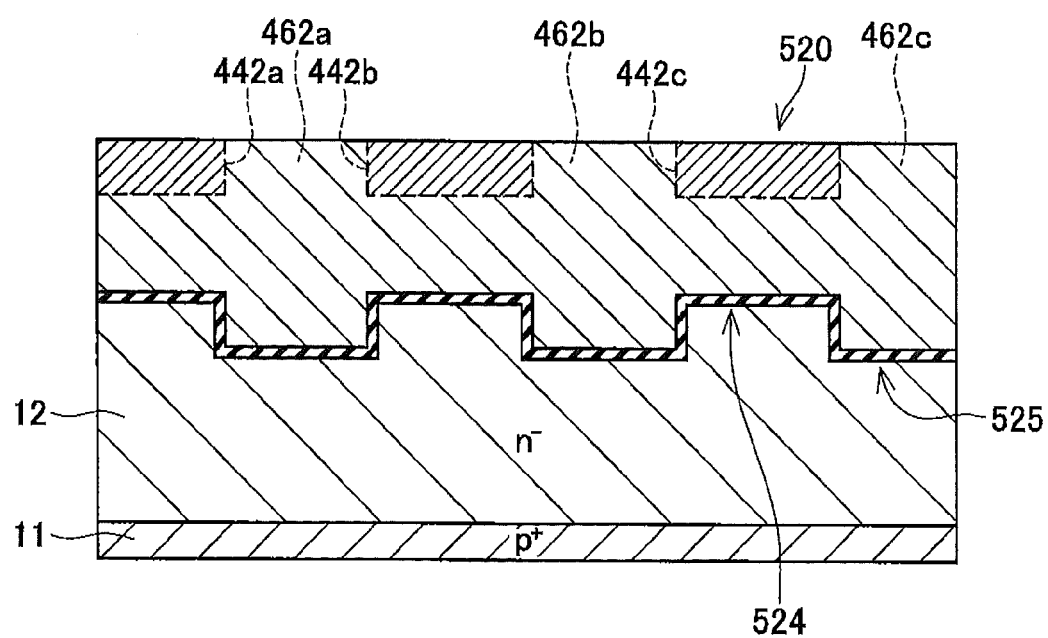
FIG. 27 is a cross-sectional view of a semiconductor device according to a modification.
Figure 28:
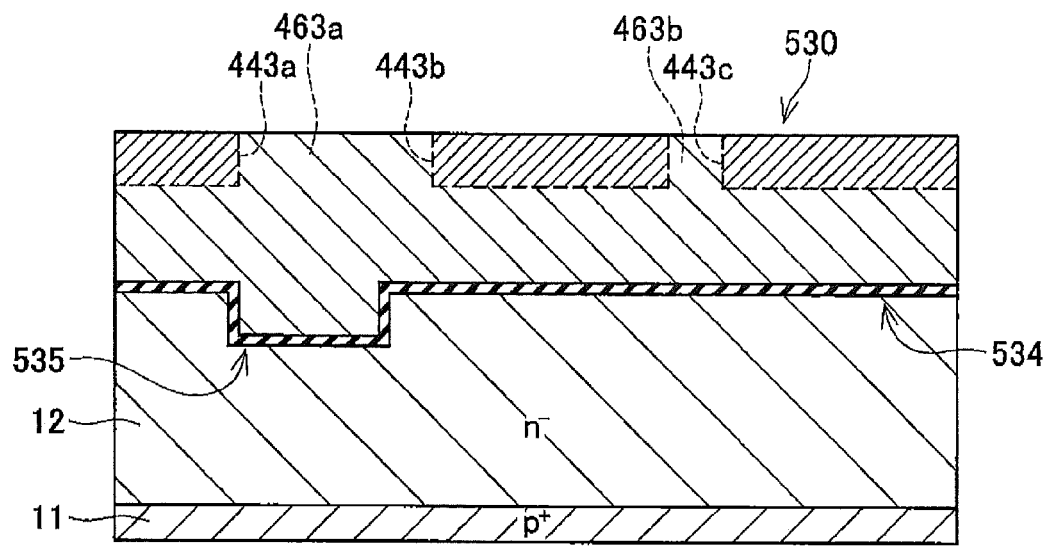
FIG. 28 is a cross-sectional view of a semiconductor device according to a modification.
Figure 29:
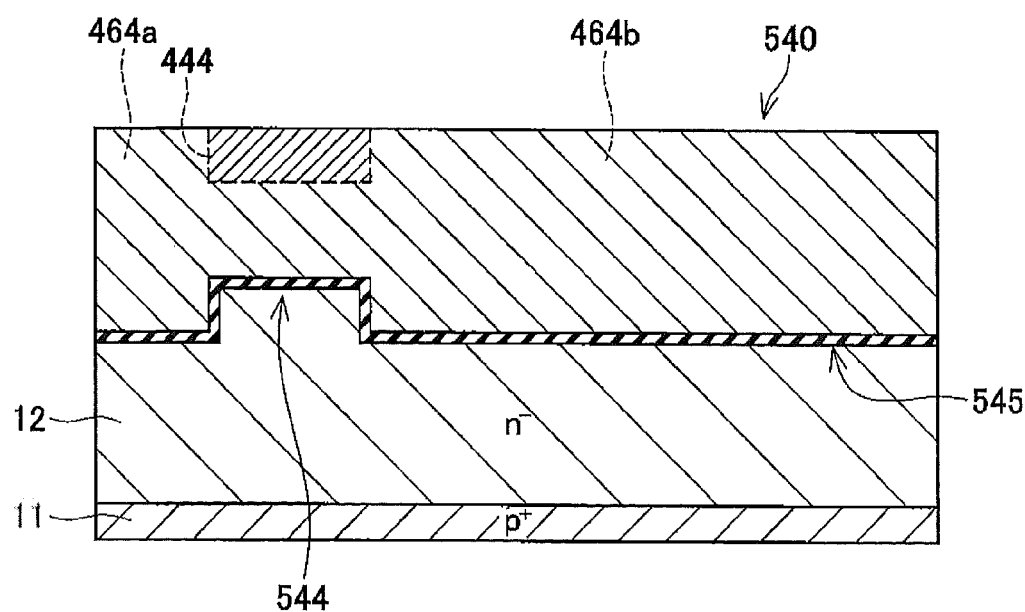
FIG. 29 is a cross-sectional view of a semiconductor device according to a modification.

As shown in FIG. 26, in the semiconductor device 40, a trench gate 510 comprising a shallow portion 514 and a deep portion 515 with depths that differ in a stepped pattern may be formed. In a case in which a trench depth differs in a stepped pattern and the deep portion 515 is formed with a uniform depth, an emitter layer 441 may be formed to a boundary between the deep portion 515 and the shallow portion 514. In addition, a bypass portion 461 may be formed over an entire surface of the semiconductor substrate opposing the deep portion 515. Furthermore, as shown in FIG. 27, flat shallow portions 524 and flat deep portions 525 with depths that differ in a stepped pattern may be alternately formed along a longitudinal direction of a trench gate 520, emitter layers 442a to 442c may be formed on a surface of the semiconductor substrate opposing the respective shallow portions 524, and bypass portions 462a to 462c may be formed on the surface of the semiconductor substrate opposing the respective deep portions 525. In addition, as shown in FIG. 28, a large portion of a trench gate 530 in a longitudinal direction may constitute a shallow portion 534 and a part of the trench gate 530 may constitute a deep portion 535. Emitter layers 443a to 443c need only be formed on a surface of a semiconductor substrate opposing the shallow portion 534 (an upper surface of a body layer 13). The emitter layers may extend to a position on a boundary between the shallow portion 534 and the deep portion 535 as is the case of the emitter layer 443a or may be formed at a part of a surface of the semiconductor substrate opposing the shallow portion 534 as is the case of the emitter layers 443b and 443c. Moreover, in addition to a bypass portion 463a formed on a surface of the semiconductor substrate opposing the deep portion 535, a bypass portion 463b may be provided which is formed on the surface of the semiconductor substrate opposing only the shallow portion 534. In addition, as shown in FIG. 29, a large portion of a trench gate 540 in a longitudinal direction may constitute a deep portion 545 and a part of the trench gate 540 may constitute a shallow portion 544. In this case, an emitter layer 444 need only be formed on a surface of the semiconductor substrate opposing the shallow portion 544, and bypass portions 464a and 464b need only be formed on a surface of the semiconductor substrate opposing the deep portion 545. While a case in which all of the trench gates have a same configuration has been exemplified and described in the second embodiment, trench gates with different configurations may coexist in a single semiconductor device. Furthermore, the semiconductor device 40 may partially comprise a trench gate that does not satisfy a condition that a trench gate comprises the deep portion with the depth that is deeper on the side of the drift layer relative to the body layer of the trench gate in at least a part of the trench gate in the longitudinal direction.

Figure 30:
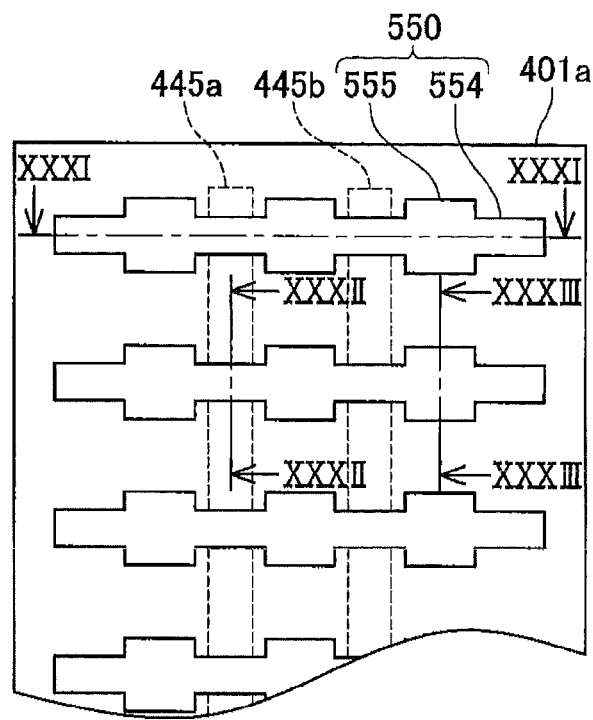
FIG. 30 is a plan view of a semiconductor device according to a modification showing an enlargement of a part of a cell region.
Figure 31:
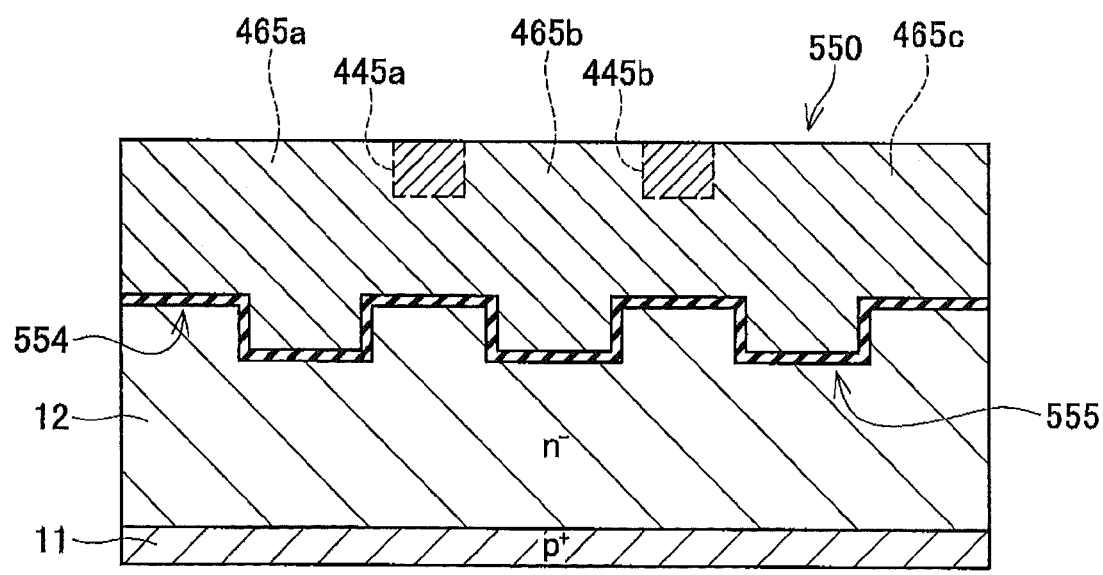
FIG. 31 is a cross-sectional view taken along line XXXI-XXXI in FIG. 30.
Figure 32:
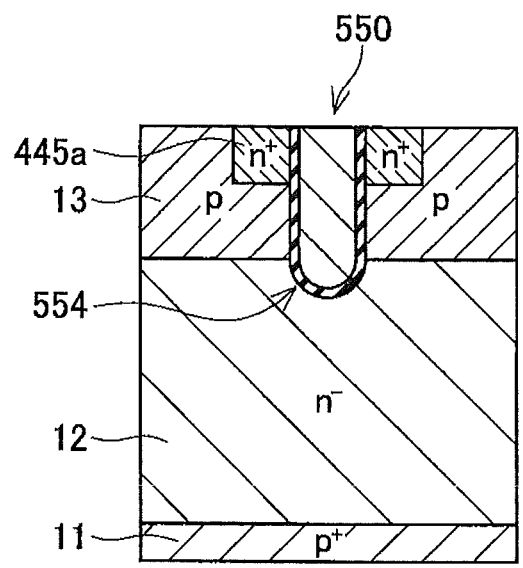
FIG. 32 is a cross-sectional view taken along line XXXII-XXXII in FIG. 30.
Figure 33:
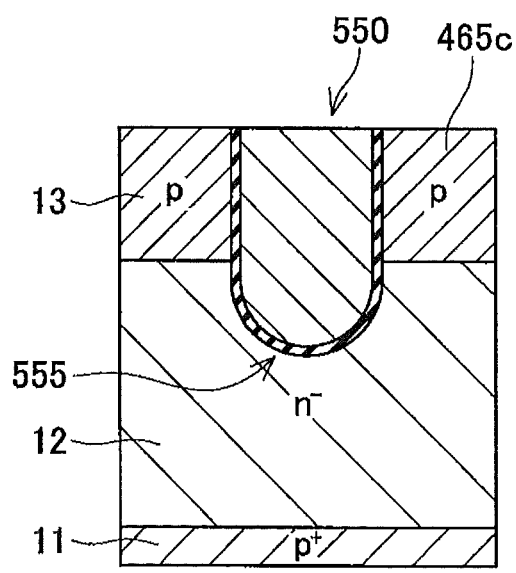
FIG. 33 is a cross-sectional view taken along line XXXIII-XXXIII in FIG. 30.

Furthermore, the semiconductor device 40 may comprise a trench gate 550 such as those shown in FIGS. 30 to 33. In the trench gate 550, the deeper a trench depth is, the wider a trench width (a length in a transverse direction in a plan view of the semiconductor device). As shown in FIG. 30, the trench gate 550 comprises, alternately in a longitudinal direction, a portion with a wide trench width and a portion with a narrow trench width. As shown in FIGS. 31 to 33, the portion with a wide trench width is a deep portion 555 with a deep trench depth, and the portion with a narrow trench width is a shallow portion 554 with a shallow trench depth. The shallow portion 554 and the deep portion 555 are alternately arranged along the longitudinal direction of the trench gate 550. Emitter layers 445a and 445b are formed on a surface of a semiconductor substrate opposing the shallow portion 554 that has the narrow trench width and the shallow trench depth. Bypass portions 465a to 465c are formed on the surface of the semiconductor substrate opposing the deep portion 555 that has the deep trench depth. As shown in FIGS. 30 to 33, by designing the trench gate so that the deeper the trench depth, the wider the trench width, the trench depth in the longitudinal direction can be varied by performing only a small number of trench etching operations. While a case of a stepped trench bottom portion has been exemplified and described with reference to FIGS. 30 to 33, a trench bottom portion with other shapes can be considered in a similar manner.

Figure 34:
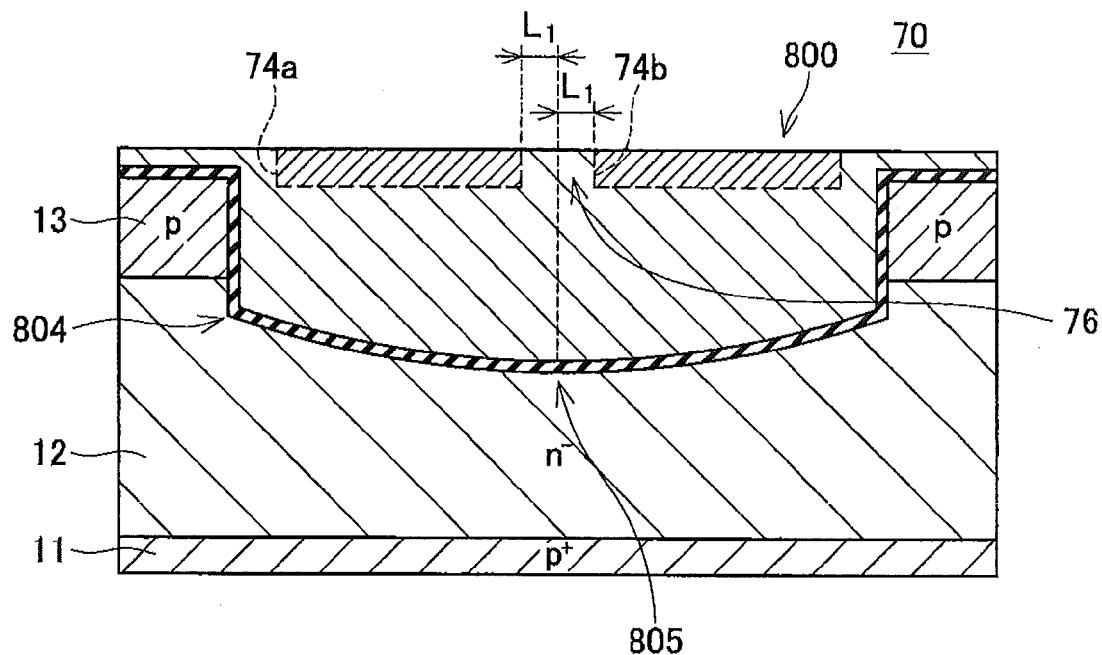
FIG. 34 is a cross-sectional view of a semiconductor device according to a modification.

Even in the semiconductor device 10 according to the first embodiment, an emitter layer can be arranged in a similar manner to the second embodiment. A trench gate 800 of a semiconductor device 70 shown in FIG. 34 gradually becomes deeper from a shallowest portion 804 to a deepest portion 805 in a similar manner to the trench gate 200 of the semiconductor device 10 shown in FIGS. 1 to 5. Emitter layers 74a and 74b of the semiconductor device 70 are formed at positions separated by a distance of $L_1$ or greater in a longitudinal direction of the trench gate 800 from a surface of a semiconductor substrate opposing the deepest portion 805 with a deepest trench depth. A body layer 13 is formed on the surface of the semiconductor substrate opposing the deepest portion 805, and constitutes a bypass portion 76 in which the emitter layer is not formed. Moreover, FIG. 34 shows projections of the emitter layers 74a and 74b along the longitudinal direction. Even in this case, the distance $L_1$ favorably satisfies $L_1 \geq 0.03 D_2$ with respect to the depth $D_2$ of the deepest portion 805 of the trench gate 800. According to the semiconductor device 70 shown in FIG. 34, since an electric field can be gradually varied along the longitudinal direction of the trench gate 800 and electrical charges can be moved from the bypass portion 76 formed on a surface of the semiconductor substrate opposing the deepest portion 805 (a center portion in the longitudinal direction) of the trench gate 800 to an upper surface side of the semiconductor substrate, an electric field concentration can be mitigated and an occurrence of a latchup can be prevented. Moreover, since a constitution of the modification shown in FIG. 34 is similar to that of the semiconductor device 10 with the exception of the emitter layer and the bypass portion, overlapping descriptions will be omitted.

Figure 35:
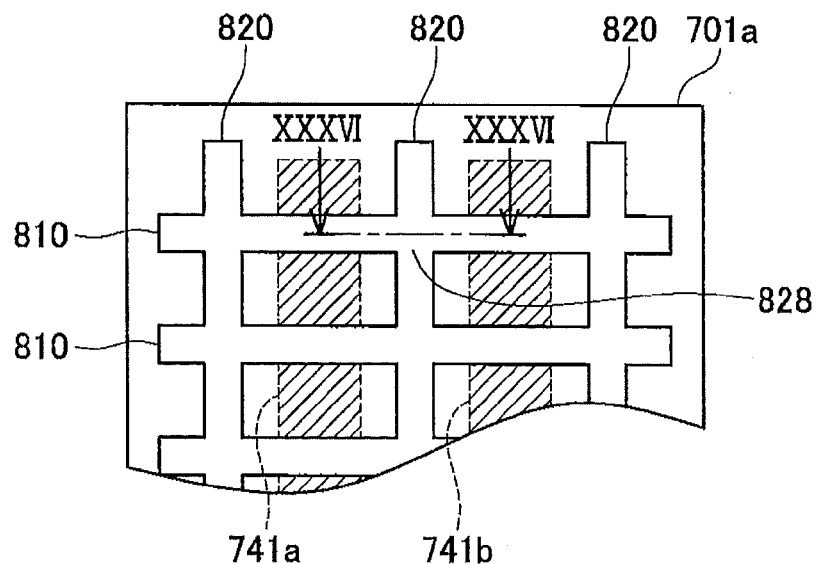
FIG. 35 is a plan view of a semiconductor device according to a modification showing an enlargement of a part of a cell region.
Figure 36:
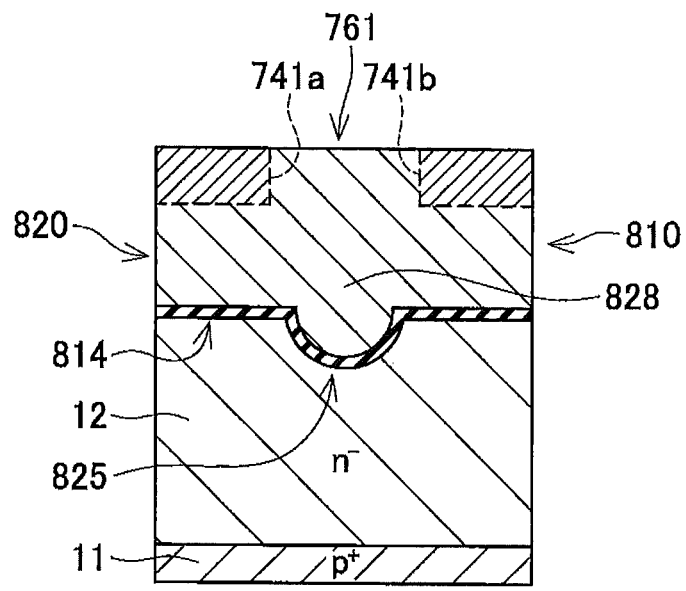
FIG. 36 is a cross-sectional view taken along line XXXVI-XXXVI in FIG. 35.

In addition, as shown in FIGS. 35 and 36, a plurality of trench gates 810 and 820 that intersects one another in a plan view of a semiconductor device may be provided. In this case, an intersection 828 at which the trench gate 810 and the trench gate 820 intersect each other constitutes a deep portion 825 that has a deep trench depth. Emitter layers 741a and 741b are formed on a surface of a semiconductor substrate opposing a shallow portion 814 that has a shallow trench depth. A surface side of the semiconductor substrate opposing the deep portion 825 is a body layer 13 and constitutes a bypass portion 761 in which an emitter layer is not formed. Moreover, although not shown, an emitter layer can also be formed on the surface side of the semiconductor substrate opposing a shallow portion of the trench gate 820. Although FIGS. 35 and 36 show a case in which a plurality of trench gates intersects each other at a plurality of locations, numbers of the trench gates and the intersections are not particularly limited.

As shown in FIGS. 37 to 40, trench gates comprising portions with a wide trench width and portions with a narrow trench width may intersect each other. In this case, depths of trench bottom portions of an intersection and a wide portion are compared, whereby a bypass portion is favorably provided on a surface of a semiconductor substrate opposing whichever portion having a deeper trench depth.

Figure 37:
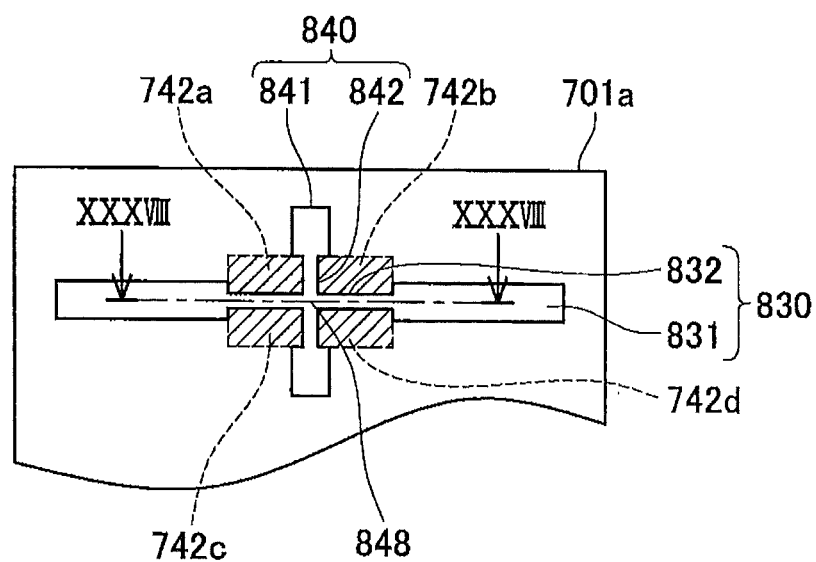
FIG. 37 is a plan view of a semiconductor device according to a modification showing an enlargement of a part of a cell region.
Figure 38:
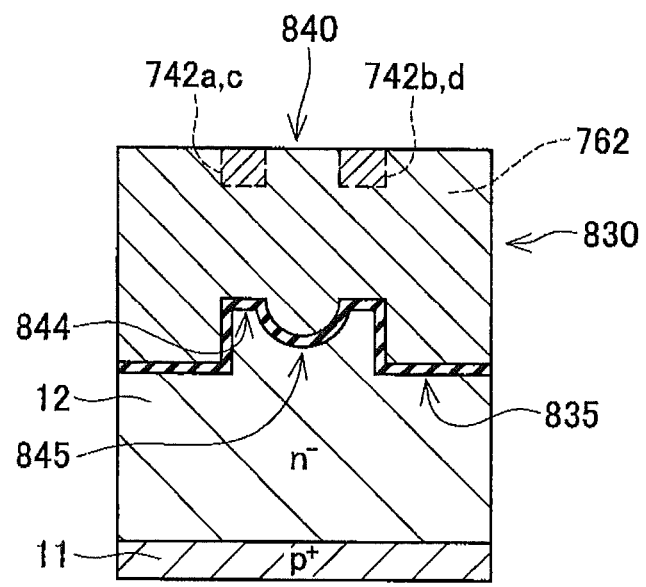
FIG. 38 is a cross-sectional view taken along line XXXVIII-XXXVIII in FIG. 37.

As shown in FIGS. 37 and 38, a trench gate 830 comprises a wide portion 831 and a narrow portion 832, and a trench gate 840 comprises a wide portion 841 and a narrow portion 842. The narrow portion 832 of the trench gate 830 and the narrow portion 842 of the trench gate 840 intersect each other. A trench depth of a trench bottom portion 845 of an intersection 848 is deeper than a trench depth of a trench bottom portion 844 of the narrow portions 832 and 842 (a trench bottom portion of the narrow portion 832 is not shown) and shallower than a trench bottom portion 835 of the wide portions 831 and 841 (a trench bottom portion of the wide portion 841 is not shown). Emitter layers 742a to 742d are formed at positions in contact with a side surface of the narrow portion 832 in a longitudinal direction (a side surface of the trench gate 830 parallel to a longitudinal direction) and a side surface of the narrow portion 842 in a longitudinal direction (a side surface of the trench gate 840 parallel to a longitudinal direction), and are not formed at positions in contact with side surfaces of the wide portions 831 and 841 in a longitudinal direction. A bypass portion 762 is formed on a surface of a semiconductor substrate along side surfaces of the wide portions 831 and 841 in a longitudinal direction.

Figure 39:
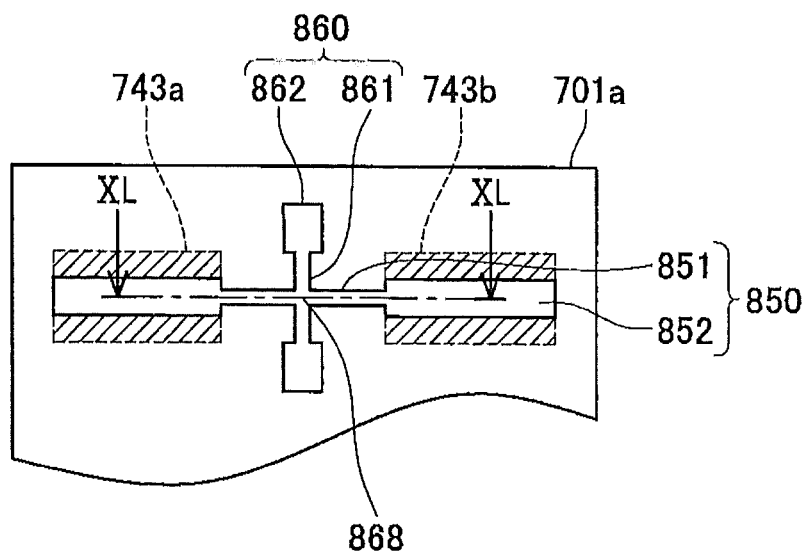
FIG. 39 is a plan view of a semiconductor device according to a modification showing an enlargement of a part of a cell region.
Figure 40:
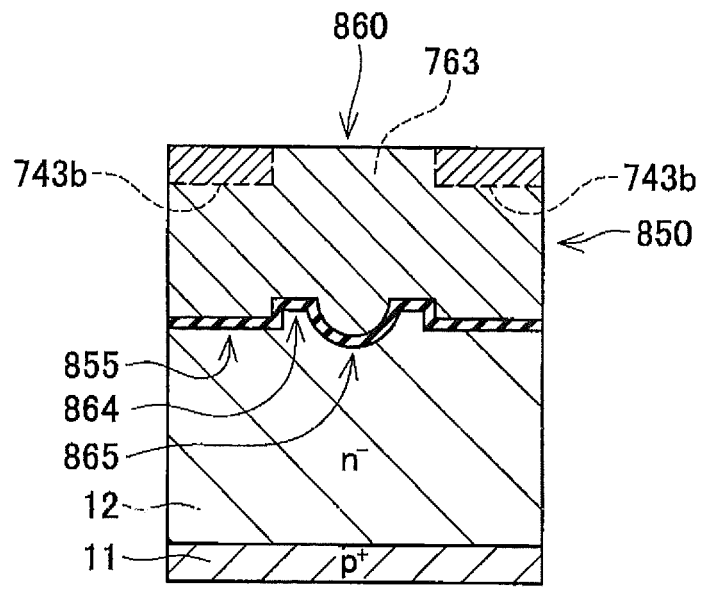
FIG. 40 is a cross-sectional view taken along line XL-XL in FIG. 39.
Figure 41:
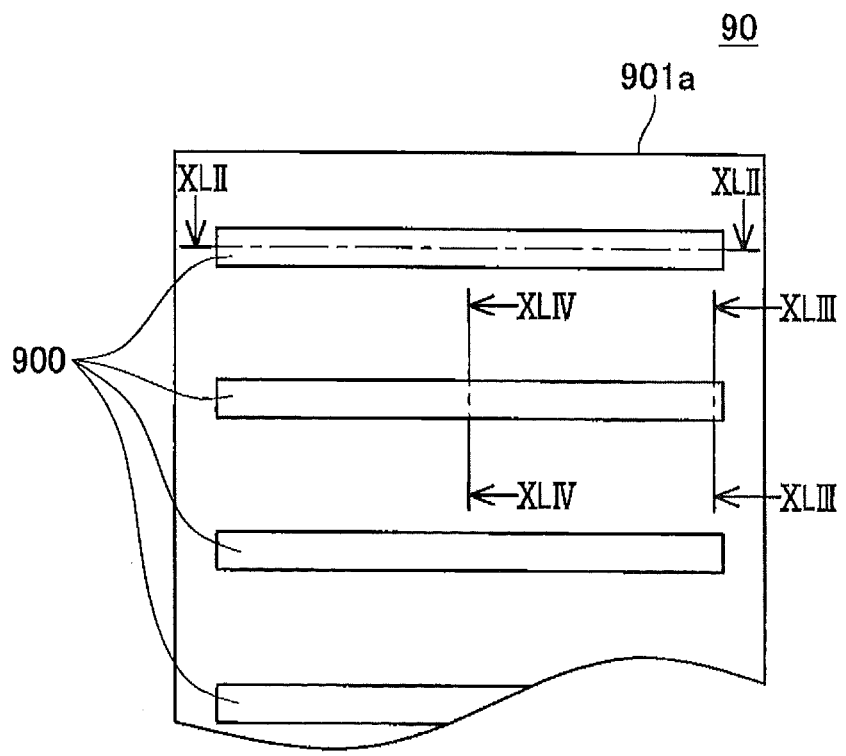
FIG. 41 is a plan view of a semiconductor device according to a modification showing an enlargement of a part of a cell region.
Figure 42:
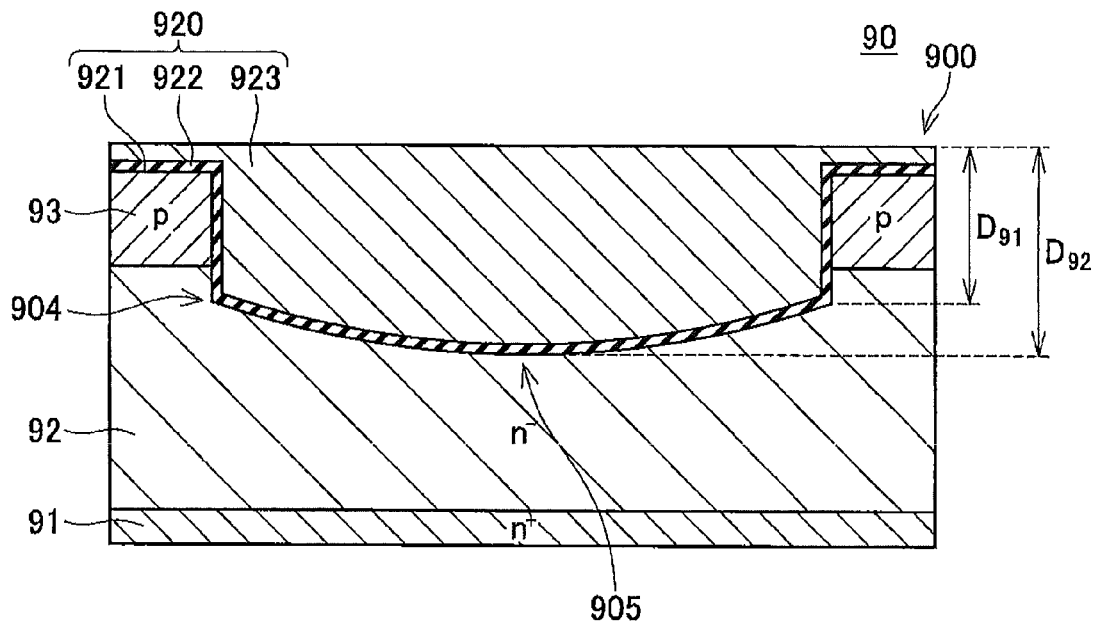
FIG. 42 is a cross-sectional view taken along line XLII-XLII in FIG. 41.
Figure 43:
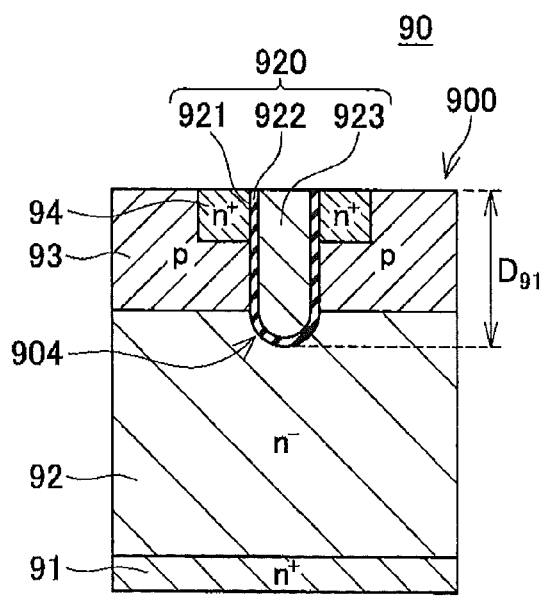
FIG. 43 is a cross-sectional view taken along line XLIII-XLIII in FIG. 41.
Figure 44:
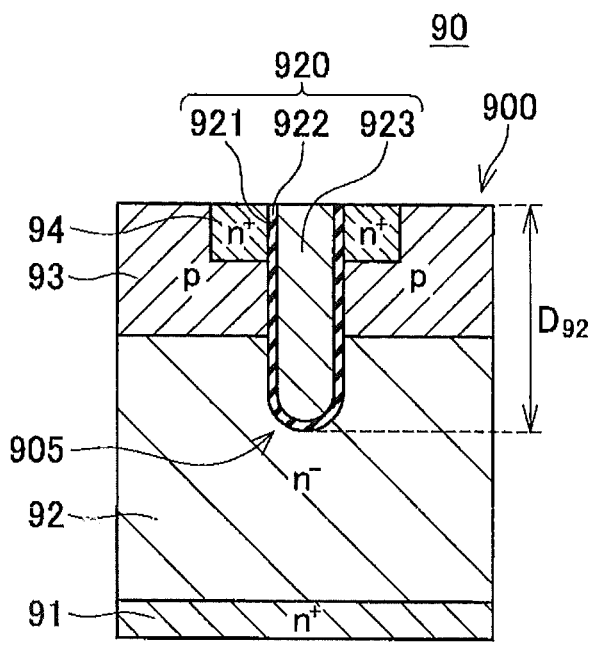
FIG. 44 is a cross-sectional view taken along line XLIV-XLIV in FIG. 41.

On the other hand, as shown in FIGS. 39 and 40, when a trench bottom portion of the intersections is deeper, emitter layers are formed at different positions. A trench gate 850 comprises a wide portion 852 and a narrow portion 851, and a trench gate 860 comprises a wide portion 862 and a narrow portion 861. The narrow portion 851 of the trench gate 850 and the narrow portion 861 of the trench gate 860 intersect each other. A trench depth of a trench bottom portion 865 of an intersection 868 is deeper than both a trench depth of a trench bottom portion 864 of the narrow portions (a trench bottom portion of the narrow portion 851 is not shown) and a trench bottom portion 855 of the wide portions 852 and 862 (a trench bottom portion of the wide portion 862 is not shown). In this case, emitter layers 743a and 743b may be formed at positions in contact with side surfaces of the wide portions 852 and 862 in a longitudinal direction. An electric charge bypass portion 763 is provided while an emitter layer in contact with the trench gates 850 and 860 is not formed at a position of the intersection 868 opposing the trench bottom portion 865. Although FIGS. 37 to 40 show cases in which two trench gates intersect each other at one location, numbers of the trench gates and the intersections are not particularly limited. For example, as shown in FIGS. 35 and 36, a plurality of trench gates may intersect each other at a plurality of locations.

While an IGBT has been exemplified and described above, a constitution of a trench gate and the like according to the present application can also be applied to other trench gate type semiconductor devices such as a MOSFET. For example, the constitution of a trench gate and the like in the IGBT shown in FIGS. 1 to 5 can also be applied to a MOSFET as shown in FIGS. 41 to 44. As shown in FIGS. 41 to 44, a plurality of trench gates 920 is formed in a cell region 901a. A trench gate type MOSFET is formed in the cell region 901a of a semiconductor device 90. A semiconductor substrate 900 comprises an $n^+$ type drain layer 91, an $n^-$ type drift layer 92, a p type body layer 93, and an $n^+$ type source layer 94. The trench gate 920 penetrates the body layer 93 and the source layer 94 from an upper surface side of the semiconductor substrate 900 and reaches the drift layer 92. The trench gate 920 comprises a trench 921, an insulating film 922 formed on an inner wall of the trench 921, and an gate electrode 923 which is covered by the insulating film 922 and which fills an inside of the trench 921. The source layer 94 extends along a longitudinal direction of the trench gate 920 and is in contact with the insulating film 922 of the trench gate 920.

In a similar manner to the first embodiment, a portion of the trench gate 920 in contact with the drift layer 92 is shallowest on both end sides in a longitudinal direction (a shallowest portion 904) and deepest at a center portion in the longitudinal direction (a deepest portion 905). A trench depth of the trench gate 920 becomes gradually deeper from the shallowest portion 904 to the deepest portion 905 in an approximately arc-like pattern. The shallowest portion 904 has a depth of $D_{91}$ from an upper surface of the semiconductor substrate 900, and the deepest portion 905 has a depth of $D_{92}$ from the upper surface of the semiconductor substrate 900. In a similar manner to the first embodiment, a difference between $D_{92}$ and $D_{91}$ favorably satisfies $D_{92} - D_{91} \geq 0.03 D_{92}$.

Figure 45:
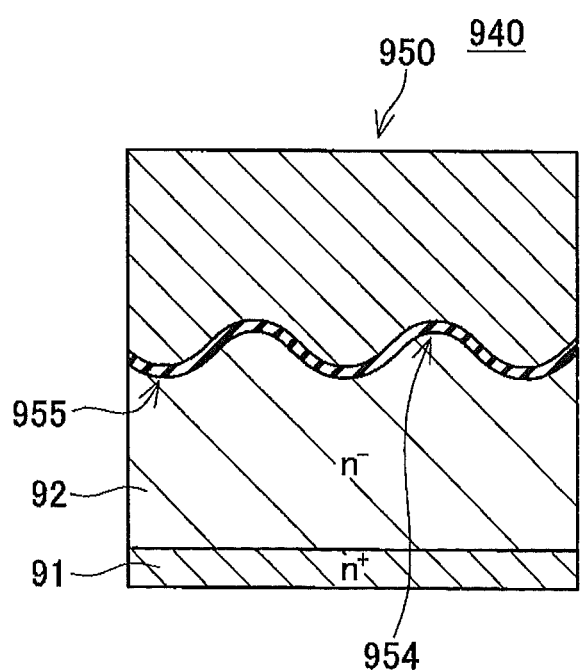
FIG. 45 is a cross-sectional view of a semiconductor device according to a modification.

In addition, for example, in a similar manner to the second embodiment, a MOSFET may comprise a trench gate with a depth that differs in a longitudinal direction. As shown in FIG. 45, a depth of a portion of a MOSFET trench gate 950 that reaches a drift layer 92 varies approximately cyclically in a curved pattern in a longitudinal direction, and comprises a plurality of shallow portions 954 with a shallow trench depth and a plurality of deep portions 955 with a deep trench depth. In this manner, structures of the trench gate and the like according to the embodiments and modifications exemplified and described by an IGBT can also be applied in case of a MOSFET, and a same operational effect of the present invention as when applied to an IGBT can be achieved.

While embodiments of the present invention have been described in detail, such embodiments are merely illustrative and are not intended to limit the scope of claims. Techniques described in the scope of claims include various modifications and changes made to the specific examples illustrated above.

It is to be understood that the technical elements described in the present description and the drawings exhibit technical usefulness solely or in various combinations thereof and shall not be limited to the combinations described in the claims at the time of filing. Furthermore, the techniques illustrated in the present description and the drawings are to achieve a plurality of objectives at the same time, whereby technical usefulness is exhibited by attaining any one of such objectives.

The invention claimed is:

1. A semiconductor device comprising:
   a first conductivity type drift region formed in a semiconductor substrate;
   a second conductivity type body region formed at an upper surface of the semiconductor substrate on an upper surface side of the drift region;
   a first conductivity type first semiconductor region formed on a part of an upper surface of the body region; and
   a trench gate type insulated gate penetrating the first semiconductor region and the body region, and formed to a depth at which the insulated gate contacts the drift region, wherein
   a part of the insulated gate on a drift region side relative to the body region becomes gradually deeper at a center portion than at a from both end portions to a center portion in a longitudinal direction of the insulated gate, and
   a bottom portion of the insulated gate has an arc-like pattern, wherein a trench width of the center portion of the insulated gate becomes wider than a trench width of each of the both end portions to the center portion of the insulated gate in a plan view of the semiconductor substrate.

2. The semiconductor device according to claim 1, further comprising:
   a bypass portion in which the first semiconductor region is not formed, the bypass portion being formed on at least a part of a surface of the semiconductor substrate opposing the center portion in the longitudinal direction of the insulated gate.

* * * * *

UNITED STATES PATENT AND TRADEMARK OFFICE
CERTIFICATE OF CORRECTION

PATENT NO. : 8,610,204 B2  
APPLICATION NO. : 13/698606  
DATED : December 17, 2013  
INVENTOR(S) : M. Senoo Page 1 of 1

It is certified that error appears in the above-identified patent and that said Letters Patent is hereby corrected as shown below:

In the Specification

At column 2, line 67, change "line in FIG. 2" to -- line III-III in FIG. 2 --.

At column 3, line 43, change "line in FIG." to -- line XXIII-XXIII in FIG. --.

At column 7, line 20, change "an $n^{31}$" to -- an $n^-$ --.

At column 10, line 27, change "an if" to -- an $n^-$ --.

Signed and Sealed this  
Third Day of June, 2014

Michelle K. Lee  
*Deputy Director of the United States Patent and Trademark Office*